(12) United States Patent
Jung et al.

(10) Patent No.: US 6,730,619 B2
(45) Date of Patent: May 4, 2004

(54) METHOD OF MANUFACTURING INSULATING LAYER AND SEMICONDUCTOR DEVICE INCLUDING INSULATING LAYER

(75) Inventors: Woo-Chan Jung, Seoul (KR); Jin-Ho Jeon, Seoul (KR); Jeon-Sig Lim, Whasung-gun (KR); Jong-Seung Yi, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 93 days.

(21) Appl. No.: 10/122,272

(22) Filed: Apr. 16, 2002

(65) Prior Publication Data

US 2002/0130385 A1 Sep. 19, 2002

Related U.S. Application Data

(63) Continuation-in-part of application No. 09/800,892, filed on Mar. 8, 2001, now Pat. No. 6,569,782.

(30) Foreign Application Priority Data

Jun. 15, 2000 (KR) .......................... 2000-32893
Apr. 19, 2001 (KR) .......................... 2001-21067

(51) Int. Cl.[7] .......................... H01L 21/31; H05H 1/24
(52) U.S. Cl. .......................... 438/783; 438/760; 438/763; 257/633; 257/641; 257/644; 257/650; 427/578; 427/579
(58) Field of Search .......................... 427/563, 574, 427/578, 579; 438/783, 784, 787, 760, 761, 763, 935, 958; 257/632, 634, 635, 640, 641, 644, 650, 633

(56) References Cited

U.S. PATENT DOCUMENTS

| | | | | |
|---|---|---|---|---|
| 4,668,973 A | | 5/1987 | Dawson et al. | |
| 4,791,005 A | * | 12/1988 | Becker et al. | 427/255.29 |
| 4,845,054 A | * | 7/1989 | Mitchener | 438/790 |
| 4,879,253 A | * | 11/1989 | Wakamatsu | 438/301 |
| 5,094,984 A | * | 3/1992 | Liu et al. | 438/760 |
| 5,104,482 A | * | 4/1992 | Monkowski et al. | 438/698 |
| 5,180,692 A | * | 1/1993 | Ibuka et al. | 438/784 |
| 5,286,681 A | * | 2/1994 | Maeda et al. | 438/760 |
| 5,336,640 A | * | 8/1994 | Sato | 438/763 |
| 5,354,387 A | * | 10/1994 | Lee et al. | 148/33.3 |

(List continued on next page.)

FOREIGN PATENT DOCUMENTS

| | | |
|---|---|---|
| EP | 0 497 541 A1 | 8/1992 |
| EP | 0860869 A1 | 8/1998 |
| JP | 62-1232 | 1/1978 |
| JP | 59-222945 | 12/1984 |
| JP | 1-122139 | 5/1989 |
| JP | 2-1922 | 1/1990 |
| JP | 4-164330 A | 6/1992 |
| JP | 8-17926 | 1/1996 |
| TW | 275699 A | 5/1996 |

Primary Examiner—Tom Thomas
Assistant Examiner—José R Díaz
(74) Attorney, Agent, or Firm—Volentine Francos, PLLC

(57) ABSTRACT

A method of manufacturing an insulating layer that ensures reproducibility across like manufacturing apparatus. The insulating layer is formed on the substrate by (a) flowing an oxidizing gas at an oxidizing gas flow rate, (b) flowing a first carrier gas at a first carrier gas flow rate while carrying a first impurity including boron flowing at a first impurity flow rate, (c) flowing a second carrier gas at a second carrier gas flow rate while carrying a second impurity including phosphorus flowing at a second impurity flow rate, and (d) flowing a silicon source material at a silicon source flow rate. The second carrier gas flow rate is greater than the first carrier gas flow rate.

28 Claims, 18 Drawing Sheets

U.S. PATENT DOCUMENTS

| | | | |
|---|---|---|---|
| 5,409,743 A | * 4/1995 | Bouffard et al. | 427/579 |
| 5,643,640 A | * 7/1997 | Chakravarti et al. | 427/578 |
| 5,646,075 A | 7/1997 | Thakur et al. | |
| 5,814,377 A | * 9/1998 | Robles et al. | 427/579 |
| 5,862,057 A | 1/1999 | Xia et al. | |
| 5,888,910 A | 3/1999 | Park | |
| 6,013,583 A | * 1/2000 | Ajmera et al. | 438/783 |
| 6,054,397 A | * 4/2000 | Teng | 438/783 |
| 6,057,250 A | * 5/2000 | Kirchhoff et al. | 438/784 |
| 6,090,675 A | * 7/2000 | Lee et al. | 438/301 |
| 6,090,725 A | 7/2000 | Yang et al. | |
| 6,114,216 A | 9/2000 | Yieh et al. | |
| 6,159,870 A | 12/2000 | Chakravarti et al. | |
| 6,177,344 B1 | * 1/2001 | Xia et al. | 438/646 |
| 6,245,688 B1 | * 6/2001 | Jing et al. | 438/760 |
| 6,248,667 B1 | 6/2001 | Kim et al. | |
| 6,261,975 B1 | 7/2001 | Xia et al. | |
| 6,294,483 B1 | * 9/2001 | Wang et al. | 438/783 |
| 6,333,277 B1 | * 12/2001 | Lin et al. | 438/758 |
| 6,511,924 B2 | * 1/2003 | Mukai et al. | 438/787 |
| 6,599,574 B1 | * 7/2003 | Yieh et al. | 427/255.29 |
| 6,602,806 B1 | * 8/2003 | Xia et al. | 438/786 |

* cited by examiner

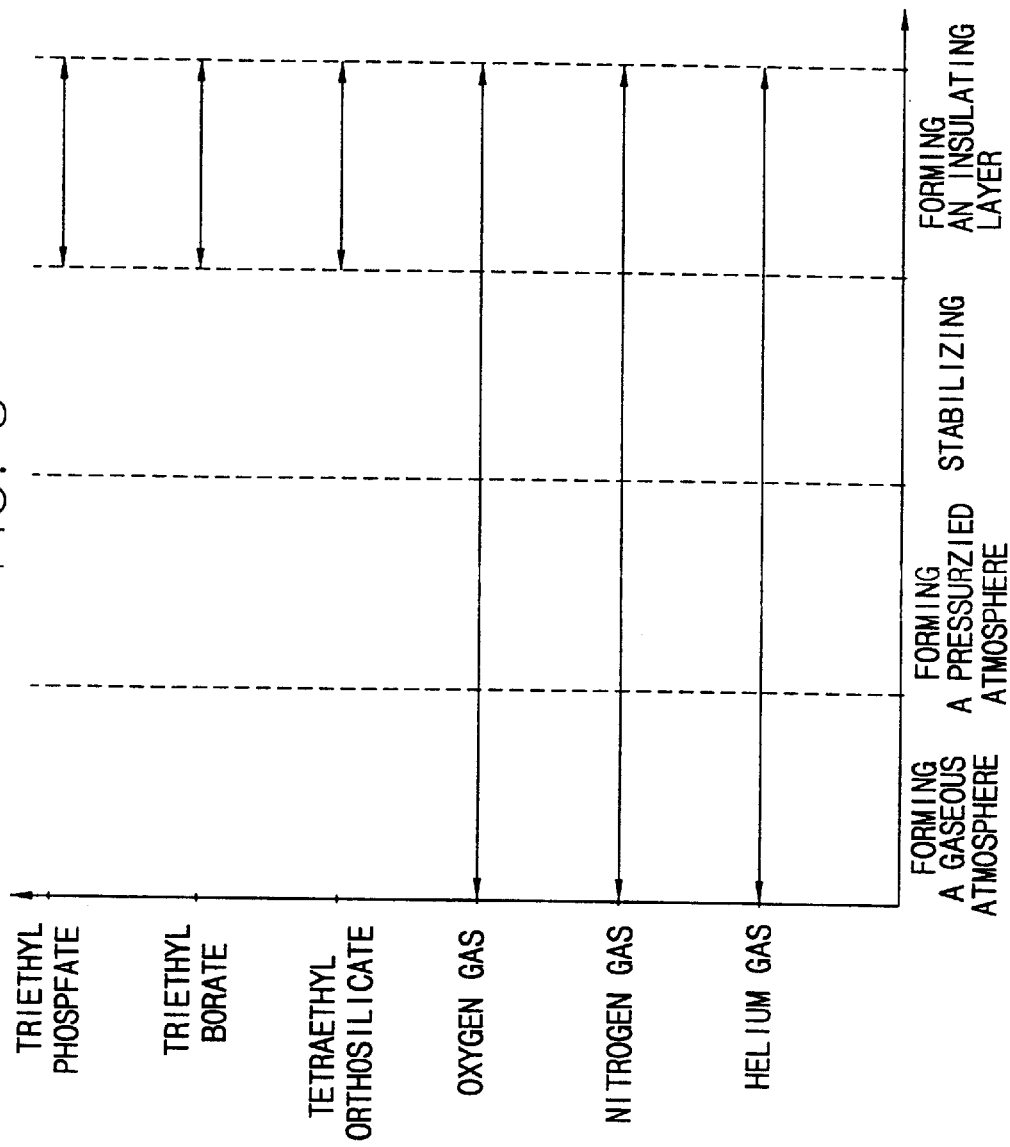

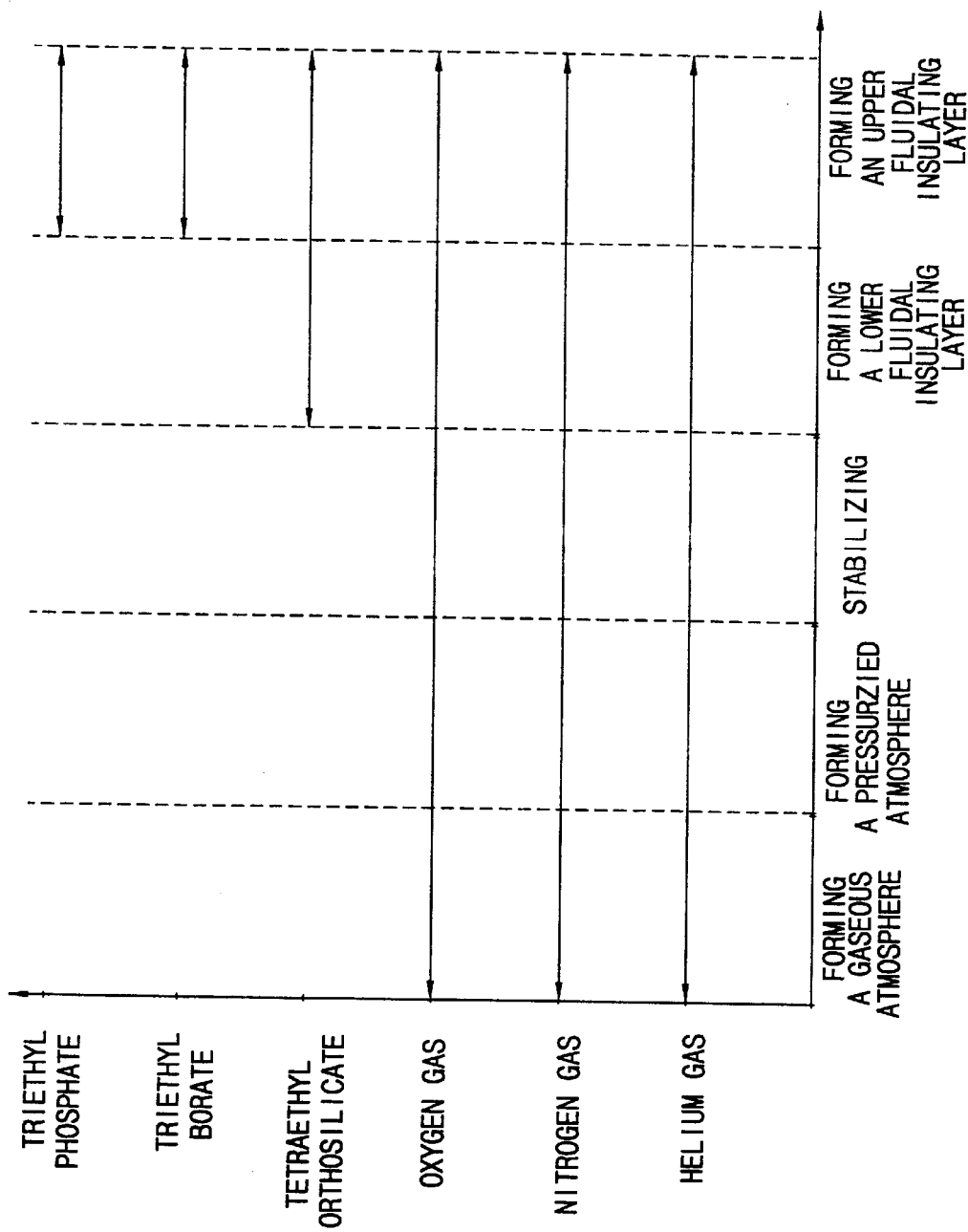

METHOD OF MANUFACTURING INSULATING LAYER AND SEMICONDUCTOR DEVICE INCLUDING INSULATING LAYER

CROSS REFERENCE TO RELATED APPLICATIONS

This is a Continuation-in-Part (CIP) of U.S. patent application Ser. No. 09/800,892, filed Mar. 8, 2001, now U.S. Pat. No. 6,569,782 B2 and entitled "INSULATING LAYER, SEMICONDUCTOR DEVICE AND METHODS FOR FABRICATING THE SAME", the contents of which are herein incorporated by reference in their entirety.

In addition, a claim of priority has been made to Korean Patent Application Nos. 2000-32893 and 2001-21067, filed Jun. 15, 2000 and Apr. 19, 2001, respectively, the contents of which are herein incorporated by reference in their entirety.

BACKGROUND OF THE INVENTION

1. Field of the Invention

The present invention generally relates to semiconductor devices and to insulating layers of semiconductor devices, and more particularly, the present invention relates to the formation of insulating layers, such as borophosphosilicate (BPSG) layers.

2. Description of the Related Art

Insulating and conductive layer fabricating techniques, utilized during manufacture of a semiconductor device, can largely be classified into two areas: physical vapor deposition and chemical vapor deposition. In the case of chemical vapor deposition (CVD), a gas source, that includes an element of an object material to be formed, and a reaction gas are supplied onto a substrate, and then the substrate is heated to initiate a chemical reaction to form a target layer on the substrate.

The CVD process characteristics used to form the layer affect not just the target layer, but also the previously formed underlying layer and any subsequent upper layers to be formed. Therefore, when forming the target layer, the chemical and physical characteristics should be sufficiently considered in view of both the process characteristics of the underlying layer and the upper layer to be formed.

A phosphosilicate glass (PSG) layer obtained by doping phosphorus into an oxide material, or a borophosphosilicate glass (BPSG) layer obtained by doping boron and phosphorus into an oxide material, are the primary layer types used as an insulating layer to protect a surface or to electrically isolate a conductive layer. This is mainly due to the excellent step coverage of these layers. Also, PSG and BPSG layers generate alkali ions while reacting as a diffusion wall against humidity, and the processes for forming the layers can be easily performed in a low temperature regime.

However, there is a disadvantage to using the PSG and BPSG layers. Since these layers exhibit fluidity and act as a diffusion wall during a reflow process, the layers also operate as an intermediary to transmit the humidity to the underlying layers. Accordingly, in a case where a layer is composed of a material that can be damaged by humidity, or where a substrate is made of silicon, the transfer of humidity may cause a serious problem. Therefore, a method to minimize the influence of the humidity has to be fully considered when the PSG or BPSG layers are being formed.

Examples of methods of forming PSG and BPSG insulating layers for minimizing the influence of the humidity are disclosed in U.S. Pat. No. 4,668,973 (issued to Dawson et al.), Japanese Patent Laid-Open No. Sho 59-222945, Japanese Patent Laid-Open No. Hei 1-122139 and Japanese Patent Laid-Open No. Hei 8-17926.

In U.S. Pat. No. 4,668,973, the PSG layer is formed by adding 7% or less of phosphorus on a silicon nitride layer after forming the silicon nitride layer on the substrate. Accordingly, the silicon nitride layer prevents the humidity from penetrating into the substrate even though the PSG layer has been reflowed. Furthermore, even if a window is formed at the PSG layer, the substrate may be prevented from being oxidized because the substrate is not directly exposed by means of the silicon nitride layer.

In Japanese Patent Laid-Open No. Sho 59-222945, a silicon nitride layer is formed on a substrate and then a BPSG layer is formed on the silicon nitride layer. The silicon nitride layer prevents the humidity from penetrating into the substrate even where the BPSG layer has been reflowed. Therefore, oxidation of the substrate by direct exposure is prevented.

In Japanese Patent Laid-Open No. Hei 1-122139, a silicon nitride layer is successively formed on the substrate and a gate electrode and thereafter a PSG layer containing boron is formed. The silicon nitride layer acts to prevent humidity from penetrating into the substrate or the gate electrode even where the PSG layer has been reflowed.

In Japanese Patent Laid-Open No. Hei 8-17926, a silicon oxide layer is formed onto a polysilicon layer and then the BPSG layer is formed onto the silicon oxide layer. Therefore, the silicon oxide layer prevents the humidity from penetrating into the polysilicon layer or the substrate even if the BPSG layer has been reflowed.

In this way, when the PSG layer or BPSG layer is formed, the effect of the humidity can be minimized by means of forming the PSG layer or BPSG layer on the underlying silicon nitride layer. Also, the silicon nitride layer prevents the underlying layer or the substrate from being damaged by means of etching, for example, when a portion of the insulating layer is patterned and etched to form a window.

When fabricating semiconductor devices having elevated regions and recessed regions composed of minute windows or gate electrodes, one must consider the need to sufficiently flow and/or fill the BPSG insulating layer into and/or up the recessed regions of the windows or the gate electrodes. Therefore, a chemical vapor deposition using a tetraethylorthosilicate (TEOS), a triethylborate (TEB), a triethylphosphate (TEPO), an oxygen gas, and an ozone gas is employed to form the BPSG layer.

As described above, first the silicon nitride layer is formed and then the BPSG layer is formed, in order to prevent the damage due to the penetration of the humidity and the etching and to obtain a sufficient filling characteristic.

The BPSG layer is formed as follows. First, an oxidizing atmosphere for easily forming the BPSG layer is prepared using an oxygen gas. After forming a first seed layer onto a silicon nitride etch stop layer using TEOS and oxygen gas, a second seed layer is formed onto the first seed layer using TEB, TEPO, TEOS and oxygen gas. The constituents of the first and second seed layers determine the amount of boron and phosphorus added into the BPSG layer. Subsequently, the BPSG layer is formed onto the etch stop layer including the first and the second seed layers by using TEB, TEPO, TEOS and ozone gas. At this time, the BPSG layer is formed with a relatively large amount of phosphorus because TEPO is used to form the second seed layer.

The BPSG layer is then reflowed utilizing nitrogen gas to planarize the surface of the BPSG layer, as well as attempt to sufficiently fill the recessed regions with this BPSG insulating layer among the elevated regions and recessed regions.

However, if the BPSG layer does not have sufficient fluidity during this reflow process with nitrogen, the BPSG layer will not sufficiently flow and/or fill into and/or up the recessed regions of the windows or the gate electrodes, and accordingly, voids are generated. Therefore, an oxygen gas and a hydrogen gas are sometimes used instead of the nitrogen gas to reflow the BPSG layer to minimize the generation of the voids.

However, when the BPSG layer has been reflowed with the oxygen gas and the hydrogen gas, the thickness of the etch stop layer under the BPSG layer is decreased. This is because phosphoric acid $H_3PO_4$ is generated by a chemical reaction between the triethylphosphate (TEPO), which determines the amount of phosphorus in the layer, and the oxygen gas and the hydrogen gas, and the phosphoric acid etches the etch stop layer while the reflowing is being performed.

Based on a transmission electron microscope (TEM) analysis of the etch stop layer before and after the reflow process, it was found that the thickness of the etch stop layer decreased by about 30% after reflowing the BPSG layer using oxygen and hydrogen gases. Also, based on an auger electron spectroscopy (AES) analysis, it was found that the oxidized materials composing the etch stop layer after reflowing were increased about 0.2 times more than before reflowing. Thus, it is confirmed that the thickness of the etch stop layer is decreased by the reflowing process and the oxidization progresses thereby.

Accordingly, the etch stop layer is unable to appropriately control the etching process when the BPSG layer is etched to form a BPSG layer pattern having a window after the reflowing. Consequently, the substrate under the etch stop layer is exposed, or even the substrate itself is etched. In a semiconductor device fabricating process which requires a fine pattern such as a self-aligned contact, the decrease in thickness of the etch stop layer precludes attaining a sufficient shoulder margin between the gate electrodes.

In contrast, even when using a BPSG layer containing a relatively large amount of boron, rather than the PSG layer containing a relatively large amount of phosphorus, the BPSG layer is not filled into the recessed regions and voids are created because the BPSG layer does not have sufficient fluidity. Also, since the BPSG layer has an isotropic etch characteristic, the etched window that is formed is larger than a predetermined critical dimension CD. Therefore, in the subsequent process for filling up the window, the window is not sufficiently filled up and a void is generated. This is because the window is formed to have a size larger than the predetermined CD, however, the filling of the window is implemented with the CD as a reference.

As described above, since the amount of phosphorus and boron added to the BPSG layer is not controlled, the thickness of the underlying etch stop layer decreases, or the etch stop layer has the isotropic etch characteristic, whereby the reliability of the semiconductor device fabricating method is reduced.

A patent application describing a method of manufacturing a BPSG layer, having substantially no characteristic change by precisely controlling the amount of phosphorus and boron, was filed in the U.S. Patent Office by certain of the present inventors (and having a common assignee) on Mar. 8, 2001 as Ser. No. 09/800,892, and entitled "INSULATING LAYER, SEMICONDUCTOR DEVICE AND METHODS FOR FABRICATING THE SAME".

According to the method disclosed in the '892 patent application, even though the BPSG layer is reflowed by utilizing a hydrogen gas and an oxygen gas, the decrease of the thickness of an etch stop layer is minimized and a sufficient filling effect and anisotropic etch characteristic can be accomplished by appropriately controlling the amount of phosphorus and boron in the BPSG layer.

FIG. 1 is a graph illustrating experimental BPSG layers having common elements manufactured by like, but discrete, apparatuses. Except for one instance, the thickness decreases of the etch stop layers range from about 35 Å to about 45 Å, after implementing the reflowing of the BPSG layer. Efforts are now being expended to further increase the reproducibility of the decrease of the thickness of the etch stop layer across like, but discrete, apparatuses for implementing the chemical vapor deposition process.

SUMMARY OF THE INVENTION

In light of the above, it is therefore an object of the present invention to provide a method of manufacturing an insulating layer having substantially the same characteristics, regardless of the particular apparatus used to manufacture the insulating layer.

Another object of the present invention is to provide a semiconductor device and a method of manufacturing the semiconductor device including an insulating layer having substantially the same characteristics that affect an underlying layer, regardless of the particular apparatus used to manufacture the insulating layer.

To accomplish these and other objects, the present invention provides a method of manufacturing an insulating layer including first creating a process atmosphere in a chamber and then forming a fluidal insulating layer on a substrate within the chamber.

The process atmosphere is created by (a) flowing an oxidizing gas at an oxidizing gas flow rate for forming an oxidizing atmosphere, (b) flowing a first carrier gas at a first carrier gas flow rate, and (c) flowing a second carrier gas at a second carrier gas flow rate, the second carrier gas flow rate being greater than the first carrier gas flow rate.

The fluidal insulating layer is formed on the substrate positioned in the chamber by (d) flowing the oxidizing gas at the oxidizing gas flow rate, (e) flowing the first carrier gas at the first carrier gas flow rate while carrying a first impurity including boron flowing at a first impurity flow rate, (f) flowing the second carrier gas at the second carrier gas flow rate while carrying a second impurity including phosphorus flowing at a second impurity flow rate, the second carrier gas flow rate being greater than the first carrier gas flow rate, and (g) flowing a silicon source material at a silicon source flow rate.

The oxidizing gas is one selected from a group consisting of oxygen gas, ozone gas and a mixture thereof, the first carrier gas is a nitrogen gas, the second carrier gas is a helium gas, the silicon source material is tetraethylorthosilicate (TEOS), the first impurity is one selected from a group consisting of triethylborate (TEB), trimethylborate (TMB), and a mixture thereof, and the second impurity is one selected from a group consisting of triethylphosphate (TEPO), trimethylphosphate (TMPO) and a mixture thereof.

For the process atmosphere, the ratio of the oxidizing gas flow rate, the first carrier gas flow rate, and the second carrier gas flow rate is about 1.00–2.50:0.70–0.95:1, and preferably the second carrier gas flow rate is at least 4,000 sccm.

For the fluidal insulating layer, the ratio of the oxidizing gas flow rate, the first carrier gas flow rate, the second carrier gas flow rate, the silicon source flow rate, the first impurity flow rate, and the second impurity flow rate is about 2.00–2.50:0.70–0.95:1:0.15–0.25:0.040–0.045:0.013–0.014, and preferably the second carrier gas flow rate is at least 4,000 sccm. The fluidal insulating layer may be reflowed after the forming thereof.

An etch stop layer may be formed on the substrate prior to forming the fluidal insulating layer, and an undoped fluidal insulating layer may be interposed between the etch stop layer and the fluidal insulating layer.

For the undoped fluidal insulating layer, a ratio of the oxidizing gas flow rate, the first carrier gas flow rate, the second carrier gas flow rate, and the silicon source flow rate is about 2.00–2.50:0.70–0.95:1:0.15–0.25, and preferably the second carrier gas flow rate is at least 4,000 sccm.

In another aspect, the present invention provides a semiconductor device including a substrate having a gate electrode formed at an upper portion of the substrate, and a source and a drain formed at a lower portion of both sides of the gate electrode.

An insulating layer is continuously formed on the substrate and the gate electrode, the insulating layer being formed by (a) flowing the oxidizing gas at the oxidizing gas flow rate, (b) flowing the first carrier gas at the first carrier gas flow rate while carrying a first impurity including boron flowing at a first impurity flow rate, (c) flowing the second carrier gas at the second carrier gas flow rate while carrying a second impurity including phosphorus flowing at a second impurity flow rate, and (d) flowing a silicon source material at a silicon source flow rate.

For the insulating layer composition, a ratio of the oxidizing gas flow rate, the first carrier gas flow rate, the second carrier gas flow rate, the silicon source flow rate, the first impurity flow rate, and the second impurity flow rate is about 2.00–2.50:0.70–0.95:1:0.15–0.25:0.040–0.045:0.013–0.014, and wherein a flow rate of the second carrier gas is preferably at least 4,000 sccm.

The oxidizing gas is one selected from a group consisting of oxygen gas, ozone gas and a mixture thereof, the first carrier gas is a nitrogen gas, the second carrier gas is a helium gas, the silicon source material is tetraethylorthosilicate (TEOS), the first impurity is one selected from a group consisting of triethylborate (TEB), trimethylborate (TMB), and a mixture thereof, and the second impurity is one selected from a group consisting of triethylphosphate (TEPO), trimethylphosphate (TMPO) and a mixture thereof.

The semiconductor device may also have an etch stop layer formed on the substrate and which underlies the insulating layer. In addition, the semiconductor device may further include an undoped insulating layer interposed between the etch stop layer and the insulating layer.

For the undoped insulating layer composition, the ratio of the oxidizing gas flow rate, the first carrier gas flow rate, the second carrier gas flow rate, and the silicon source flow rate is about 2.00–2.50:0.70–0.95:1:0.15–0.25.

According to the present invention, the characteristics of the insulating layer can be reproduced with great certainty, across a plurality of like apparatuses. Moreover, the insulating layer can be employed when implementing a self aligned contact process and when forming a fine pattern with a design rule of 0.15 μm or less.

BRIEF DESCRIPTION OF THE DRAWINGS

The above objects and advantages of the present invention will become more apparent by describing preferred embodiments in detail with reference to the attached drawings in which:

FIG. 5 is a graph classifying processing gases and materials provided for the manufacture of an insulating layer according to a first embodiment of the present invention;

FIG. 7 is a graph classifying processing gases and materials provided for the manufacture of an insulating layer according to a second embodiment of the present invention;

DETAILED DESCRIPTION OF THE PREFERRED EMBODIMENT

Hereinafter, the present invention will be described more fully with reference to the accompanying drawings, in which non-limiting preferred embodiments of the present invention are shown by way of example.

Figure 1:
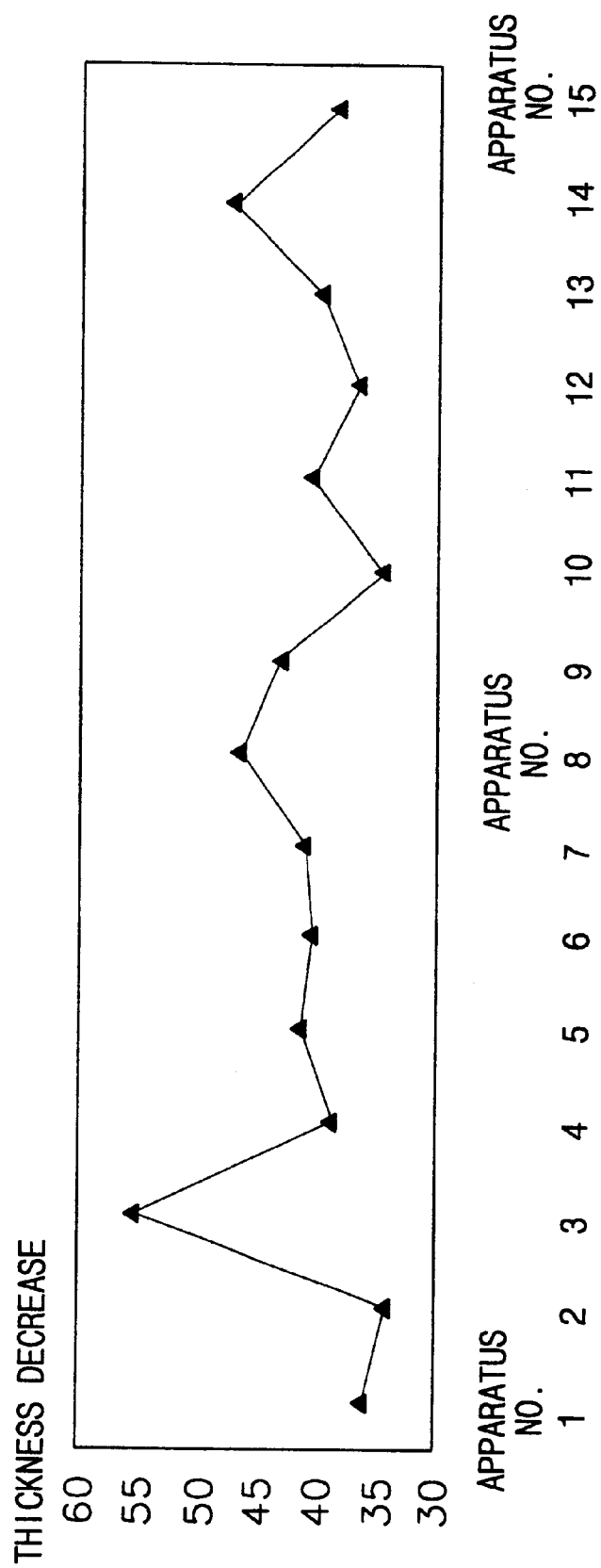
FIG. 1 is a graph illustrating the decrease of the thickness of an etch stop layer after reflowing a BPSG layer manufactured by a conventional method.
Figure 2A:
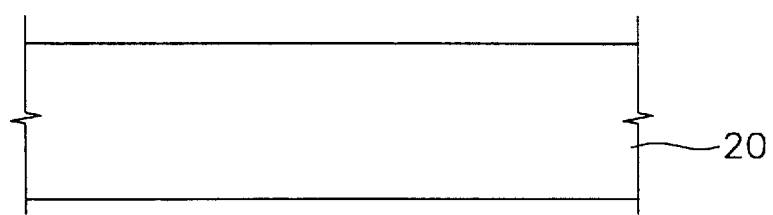
FIGS. 2A, 2B and 2C are cross-sectional views of a method of manufacturing an insulating layer according to a first embodiment of the present invention.
Figure 2B:
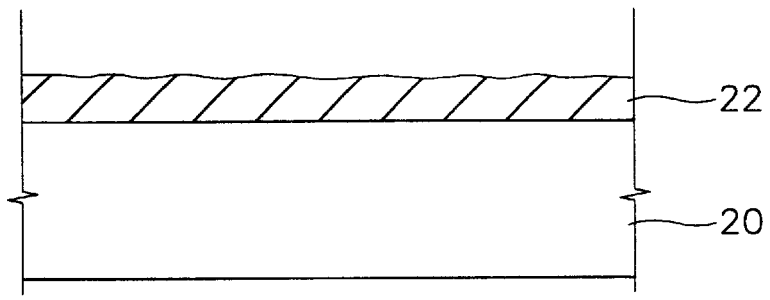
Figure 2C:
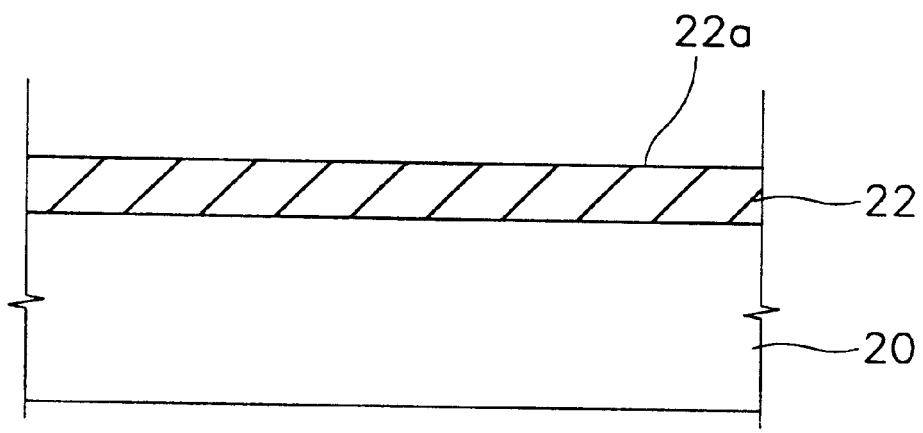

FIGS. 2A, 2B and 2C are cross-sectional views for explaining a method of manufacturing an insulating layer according to a first embodiment of the present invention. In general, in FIG. 2A, a silicon substrate 20 is provided. A BPSG layer is then formed on the substrate 20, as a fluidal insulating layer 22, as shown in FIG. 2B. In FIG. 2C, the BPSG layer 22 is reflowed at a high temperature while supplying an oxygen gas and a hydrogen gas to planarize the surface and form a planarized BPSG layer 22a. A detailed description of the insulating layer and process characteristics will be set forth later.

Figure 3:
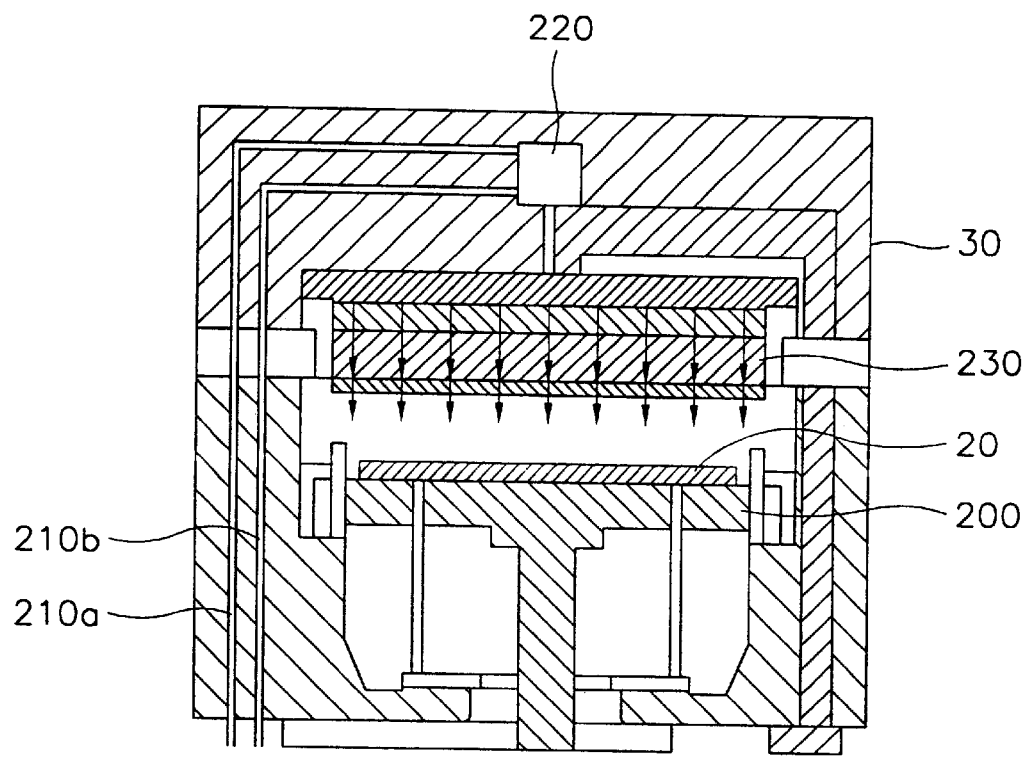
FIG. 3 is a side cutaway view of an apparatus for manufacturing an insulating layer according to a first embodiment of the present invention.

FIG. 3 is a side cutaway view of an apparatus for manufacturing an insulating layer according to the first embodiment of the present invention.

Referring to FIG. 3, a process chamber 30 contains a stage 200 that supports the substrate 20. Within the stage 200, heating elements (not shown) are provided to heat the substrate 20 during the formation of the insulating layer. In addition, conventional lifting elements communicate with the stage 200 to move the substrate 20 upward and downward during the formation of the insulating layer. Since the gap between the substrate and the process gases affects the uniformity of the insulating layer 22, the up and down positioning of the substrate 20 is precisely controlled for each process step.

Gas supply lines 210a and 210b supply reacting gases for each process step, and a gas mixing chamber 220 is provided at the end of the gas supply lines 210a and 210b for mixing the reacting gases supplied therethrough.

Figure 4:
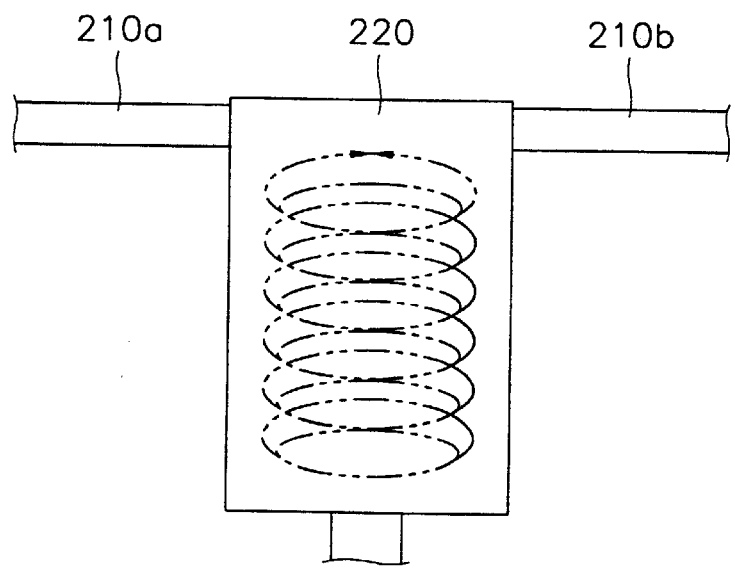
FIG. 4 is a schematic diagram of a mixing process of reactant gases in the apparatus illustrated in FIG. 3.

FIG. 4 is a schematic view of a reactant gas mixing chamber 220 as illustrated in FIG. 3. Referring to FIG. 4, the gas mixing chamber 220 is connected to the gas supply lines 210a and 210b. The reacting gases are first supplied to the gas mixing chamber 220 and are mixed within the gas mixing chamber 220, and thereafter are supplied into the process chamber 30.

Referring back to FIG. 3, a plate 230 is installed for uniformly supplying the reacting gases provided from the gas mixing chamber 220 onto the substrate 20 in the process chamber 30. The plate 230 contains vias or holes for uniformly providing the mixed gases onto the substrate 20 through the holes.

The method of manufacturing the insulating layer 22 utilizing the deposition apparatus of FIG. 3 will now be described in greater detail. In addition, the diagram of FIG. 5 illustrates the processing gases and materials provided during the manufacture of an insulating layer according to the first embodiment of the present invention.

Referring to FIG. 3 and FIG. 5, the substrate 20 is positioned in the process chamber 30. Then, a mixed gas containing an oxygen gas having a flow rate of about 4,500 sccm, a nitrogen gas having a flow rate of about 3,000 sccm, and a helium gas having a flow rate of about 4,000 sccm, is provided into the process chamber 30, to create or form a gaseous atmosphere in the process chamber 30. In other words, a ratio of the oxygen gas flow rate, the nitrogen gas flow rate, and the helium gas flow rate is about 1.00–2.50:0.70–0.95:1, with the helium gas flow rate being preferably 4,000 sccm.

The distance between the stage 200 on which the substrate 20 is positioned and the plate 230 is maintained at about 500 mils (1 mil=25 $\mu$m) during this process. The formation of the gaseous atmosphere is a first step toward ensuring the uniformity of the fluidal insulating layer 22 to be formed on the substrate 20.

This step of forming the gaseous atmosphere is controlled for a period of time preferably not exceeding five seconds. If the formation of the gaseous atmosphere progresses in excess of the given period of time (e.g., in excess of five seconds), a process error may be deemed to have occurred.

After forming the gaseous atmosphere, the flow rate of the oxygen gas is increased to about 9,500 sccm, while the flow rates of the nitrogen gas (about 3,000 sccm) and the helium gas (about 4,000 sccm) remain the same, and these gases are all are provided into the process chamber 30 via the mixing chamber 220. In other words, a ratio of the oxygen gas flow rate, the nitrogen gas flow rate and the helium gas flow rate is about 2.00–2.50:0.70–0.95:1, with the helium gas flow rate being preferably 4,000 sccm.

A processing pressure atmosphere is then formed in the process chamber 30 by utilizing a pumping apparatus (not shown) connected with the process chamber 30. This step of forming the pressurized atmosphere in the process chamber 30 is controlled for a period of time at a predetermined pressure. The maximum control time is sixty seconds and the minimum pressure is 160 Torr. If the formation of the pressurized atmosphere in the process chamber 30 progresses beyond 60 seconds or dips below 160 Torr, a process error is deemed to have occurred. The distance between the stage 200 on which the substrate 20 is positioned and the plate 230 is kept to about 500 mils. In addition, the temperature in the process chamber 30 kept at about 480° C.

After the pressurized atmosphere is formed, the flow rates of the oxygen gas (about 9,500 sccm), the nitrogen gas (about 3,000 sccm), and the helium gas (about 4,000 sccm) are maintained and provided into the process chamber 30, and then the pumping process is paused to stabilize the processing pressure atmosphere. This stabilizing step is controlled for a period of time, not to exceed 15 seconds. If the formation of the stabilized atmosphere progresses beyond fifteen seconds, it is judged as a process error. The distance between the stage 200 on which the substrate 20 is positioned and the plate 230 is decreased to about 220 mils, while the temperature in the process chamber 30 is maintained at about 480° C.

After the steps of forming the gaseous atmosphere, forming the pressurized atmosphere, and stabilization are completed, the step of forming the BPSG insulating layer can commence.

During the step of forming the BPSG insulating layer, the flow rates of the oxygen gas (about 9,500 sccm), the nitrogen gas (about 3,000 sccm), and the helium gas (about 4,000 sccm) are maintained and provided into the process chamber 30. In addition, tetraorthosilicate (TEOS) having a flow rate of about 800 sccm, triethylborate (TEB) having a flow rate of about 170 sccm, and triethylphosphate (TEPO) having a flow rate of about 55 sccm, are provided into the process chamber 30. In other words, the ratio of the oxygen gas flow rate, the nitrogen gas flow rate, the helium gas flow rate, the TEOS flow rate, the TEB flow rate, and the TEPO flow rate is about 2.00–2.50:0.70–0.95:1:0.15–0.25:0.040–0.045:0.013–0.014, with the helium gas flow rate being preferably 4,000 sccm.

As a result, a BPSG layer is formed as a fluidal insulating layer 22 on the substrate 20 in process chamber 30. At this time, the formation of the BPSG layer is controlled for a period of time, not to exceed 15 seconds. If the formation of the BPSG layer progresses beyond fifteen seconds, it is judged as a process error. The distance between the stage 200 on which the substrate 20 is positioned and the plate 230 is kept to about 220 mils, and the temperature in the process chamber 30 is maintained at about 480° C. Further, the process is controlled to form the BPSG layer 22 to a thickness of about 8,000 to about 10,000 Å.

Here, when forming the BPSG layer, preferably tetraorthosilicate (TEOS) is utilized as a silicon source material and triethylborate (TEB) may be utilized as a boron source material. TEOS and TEB can be mixed without producing any by-products and the mixture is heat stable, making TEB a good boron source material. Alternatively, a mixture of triethylborate (TEB) and trimethylborate (TMB) can be used as a boron source material. The nitrogen gas is used as the carrier gas for the boron source material, as well as to control the concentration of the boron source material.

TEOS is the preferred silicon source for the formation of a fluidal insulating layer formed by a chemical vapor deposition method. TEOS generates less particles than silane and is more advantageous in handling characteristics.

Triethylphosphate (TEPO) may be utilized as a phosphorus source material when forming the BPSG layer, and is a preferred source of phosphorous as compared to phosphine ($PH_3$). Alternatively, a mixture of triethylphosphate (TEPO) and trimethylphosphate (TMPO) can also be used as a phosphorus source material. The helium gas is used as the carrier gas for the phosphorus source material, as well as to control the concentration of the phosphorus source material.

Note that in each of the steps, the oxygen gas has the highest flow rate, and the helium gas has a higher flow rate than the nitrogen gas.

The BPSG layer, including about 5.5% by weight of boron and about 3.0% by weight of phosphorus, can be formed by controlling the flow rates of the TEB as the boron source, and the TEPO as the phosphorus source.

The reproducibility of the manufacturing process of the BPSG layer as the fluidal insulating layer 22 can be sufficiently established by controlling the flow rate of the carrier gas, the nitrogen gas and the helium gas. That is, when manufacturing the BPSG layer by utilizing a plurality of like apparatuses having the same elements, the BPSG layer having substantially the same characteristics can be obtained. The fluidal insulating layer 22 (as shown in FIG. 2C), is reflowed at a high temperature while supplying an oxygen gas and a hydrogen gas to planarize the surface of the fluidal insulating layer to form the planarized BPSG layer 22a. Accordingly, the reproducibility of the BPSG layer as the fluidal insulating layer 22 can be sufficiently established by implementing the above-described process.

FIGS. 6A through 6D are cross-sectional views for explaining a method of manufacturing an insulating layer according to a second embodiment of the present invention. FIG. 7 is a graph classifying the processing gases and materials provided for the manufacture of the insulating layer according to the second embodiment of the present invention. For the manufacture of the insulating layer according to the second embodiment, an apparatus having the same elements as illustrated in FIGS. 3 and 4 is utilized.

Figure 6A:
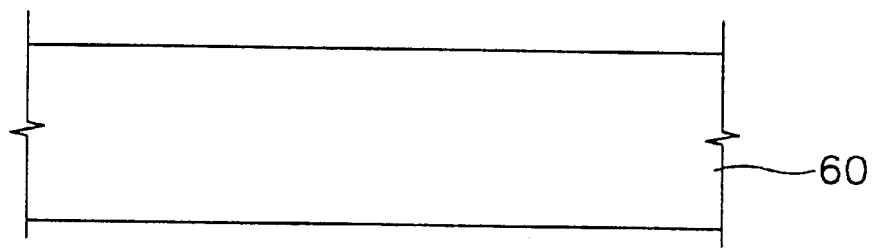
FIGS. 6A through 6D are cross-sectional views of a method of manufacturing an insulating layer according to a second embodiment of the present invention.

Referring to FIG. 6A, the substrate 60 is positioned in the process chamber 30. Then, an oxygen gas having a flow rate of about 4,500 sccm, a nitrogen gas having a flow rate of about 3,000 sccm and a helium gas having a flow rate of about 4,000 sccm are provided into the process chamber 30, to create or form a gaseous atmosphere in the process chamber 30. In other words, a ratio of the oxygen gas flow rate, the nitrogen gas flow rate and the helium gas flow rate is about 1.00–2.50:0.70–0.95:1, with the helium gas flow rate being preferably 4,000 sccm.

This step of forming the gaseous atmosphere is controlled for a period of time not exceeding five seconds. If the formation of the gaseous atmosphere progresses for five seconds or more, it is judged as a process error. The distance between the stage 200 on which the substrate 20 is positioned and the plate 230 is kept to about 500 mils (1 mil=25 µm) during this process.

After forming the gaseous atmosphere, the flow rate of the oxygen gas is increased to about 9,500 sccm, while the flow rates of the nitrogen gas (about 3,000 sccm) and the helium gas (about 4,000 sccm) remain the same, and all are provided into the process chamber 30. In other words, a ratio of the oxygen gas flow rate, the nitrogen gas flow rate and the helium gas flow rate is about 2.00–2.50:0.70–0.95:1, with the helium gas flow rate being preferably 4,000 sccm.

A processing pressure atmosphere is then formed in the process chamber 30 by utilizing a pumping apparatus (not shown) connected with the process chamber 30. This step of forming the pressurized atmosphere in the process chamber 30 is controlled for a period of time at a predetermined pressure. The maximum control time is sixty seconds and the minimum pressure is 160 Torr. If the formation of the pressurized atmosphere in the process chamber 30 progresses beyond 60 seconds or dips below 160 Torr, it is judged as a process error. The distance between the stage 200 on which the substrate 20 is positioned and the plate 230 is kept to about 500 mils. In addition, the temperature in the process chamber 30 kept at about 480° C.

After the pressurized atmosphere is formed, the flow rates of the oxygen gas (about 9,500 sccm), the nitrogen gas (about 3,000 sccm), and the helium gas (about 4,000 sccm) are maintained and provided into the process chamber 30, and then the pumping process is paused to stabilize the processing pressure atmosphere. This stabilizing step is controlled for a period of time, not to exceed 15 seconds. If the formation of the stabilized atmosphere progresses beyond fifteen seconds, it is judged as a process error. The distance between the stage 200 on which the substrate 20 is positioned and the plate 230 is decreased to about 220 mils, while the temperature in the process chamber 30 is maintained at about 480° C.

Figure 6B:
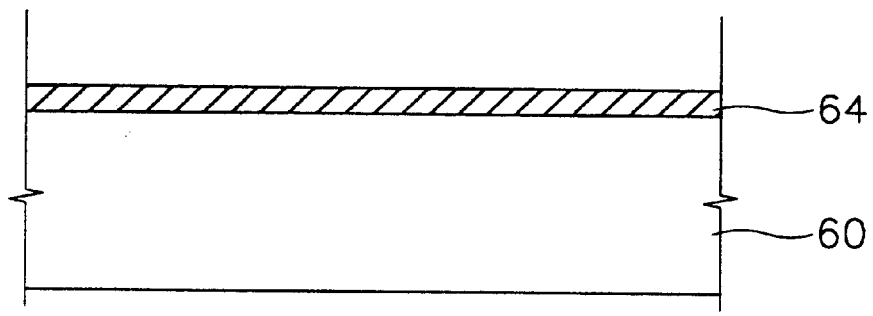

Referring to FIG. 6B, after the steps of forming the gaseous atmosphere, forming the pressurized atmosphere, and stabilization are completed, a lower fluidal insulating layer 64 is formed on the substrate 60. The lower fluidal insulating layer 64 is not doped and is formed in the apparatus of FIGS. 3 and 4 as follows.

The oxygen gas having a flow rate of about 9,500 sccm, the nitrogen gas having a flow rate of about 3,000 sccm and the helium gas having a flow rate of about 4,000 sccm are provided into the process chamber 30. In addition, tetraorthosilicate (TEOS) having a flow rate of about 800 sccm is provided into the process chamber 30 as a silicon source, and the undoped lower fluidal insulating layer 64 is formed on the substrate 60. In other words, the ratio of the oxygen gas flow rate, the nitrogen gas flow rate, the helium gas flow rate, and the TEOS flow rate, is about 2.00–2.50:0.70–0.95:1:0.15–0.25, with the helium gas flow rate being preferably 4,000 sccm.

This step of forming the undoped lower fluidal insulating layer 64 is controlled for a period of time not exceeding three seconds, and if the step progresses for three seconds or more, it is judged as a process error. The distance between the stage 200 on which the substrate 60 is positioned and the plate 230 is kept to about 220 mils. In addition, the temperature in the process chamber 30 is maintained at about 480° C. Further, the process is controlled to form the lower fluidal insulating layer 64 to a thickness of about 30 to about 50 Å.

Figure 6C:
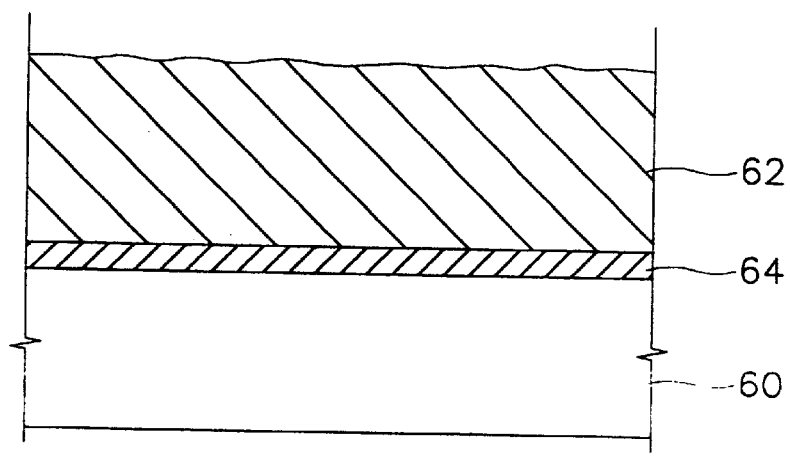

Referring to FIG. 6C, an upper fluidal insulating 62 is formed on the undoped lower fluidal insulating layer 64. To form the upper fluidal insulating 62, the flow rates of the oxygen gas (about 9,500 sccm), the nitrogen gas (about 3,000 sccm), and the helium gas (about 4,000 sccm) are maintained and provided into the process chamber 30. In addition, tetraorthosilicate (TEOS) having a flow rate of about 800 sccm, triethylborate (TEB) having a flow rate of about 170 sccm, and triethylphosphate (TEPO) having a flow rate of about 55 sccm, are provided into the process chamber 30. In other words, the ratio of the oxygen gas flow rate, the nitrogen gas flow rate, the helium gas flow rate, the TEOS flow rate, the TEB flow rate, and the TEPO flow rate is about 2.00–2.50:0.70–0.95:1:0.15–0.25:0.040–0.045:0.013–0.014, with the helium gas flow rate being preferably 4,000 sccm.

As a result, a BPSG layer is formed as an upper fluidal insulating layer 62 on the undoped lower fluidal insulating layer 64. At this time, the formation of the upper fluidal insulating 62 is controlled for a period of time, not to exceed 15 seconds. If the formation of the upper fluidal insulating 62 progresses beyond fifteen seconds, it is judged as a process error. The distance between the stage 200 on which the substrate 60 is positioned and the plate 230 is kept to about 220 mils, and the temperature in the process chamber 30 is maintained at about 480° C. Further, the process is controlled to form the upper fluidal insulating 62 to a thickness of about 8,000 to about 10,000 Å.

Here, the functions and reactions of the oxygen gas, nitrogen gas, helium gas, tetraorthosilicate (TEOS), triethylborate (TEB), and triethylphosphate (TEPO) are substantially the same as described in the first embodiment. In addition, the alternative substituents for triethylborate and triethylphosphate, namely TMB and TMPO, respectively, also are the same. Note that in each of the steps, the oxygen gas has the highest flow rate, and the helium gas has a higher flow rate than the nitrogen gas.

In this second embodiment, the undoped lower fluidal insulating layer 64 functions as a buffer and minimizes any changes to the characteristics of the BPSG layer.

The BPSG layer (upper fluidal insulating layer 62), including about 5.5% by weight of boron and about 3.0% by weight of phosphorus, can be formed by controlling the flow rates of triethylborate (TEB) which is supplied as the boron source, and triethylphosphate (TEPO) which is supplied as the phosphorus source. The reproducibility of the manufacturing process of the BPSG layer as the fluidal insulating layer 62 can be sufficiently established by controlling the flow rate of the carrier gas, the nitrogen gas and the helium gas. Accordingly, when manufacturing the upper fluidal insulating layer 62 by utilizing a number of like apparatuses having the same elements, the upper fluidal insulating layer 62 having substantially the same characteristics can be obtained.

Figure 6D:
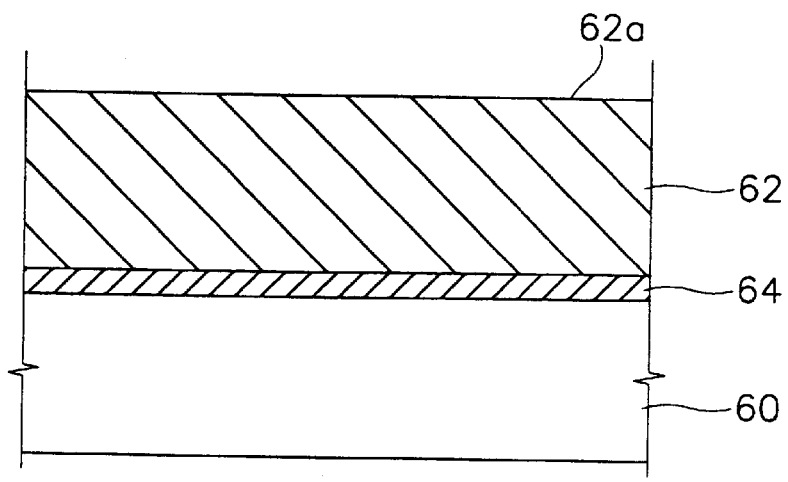

Referring to FIG. 6D, the upper fluidal insulating layer 62 is reflowed at a high temperature while supplying an oxygen gas and a hydrogen gas to planarize the surface and form the planarized BPSG layer 62a. At this time, when manufacturing the upper fluidal insulating layer 62 by utilizing a plurality of like apparatuses having the same elements, the upper fluidal insulating layer 62 having substantially the same characteristic change after implementing the reflowing process can be obtained. Accordingly, the reproducibility of the BPSG layer as the fluidal insulating layer 62 can be sufficiently established by implementing the above-described process.

FIGS. 8A through 8D are cross-sectional views for explaining a method of manufacturing an insulating layer according to a third embodiment of the present invention.

Figure 8A:
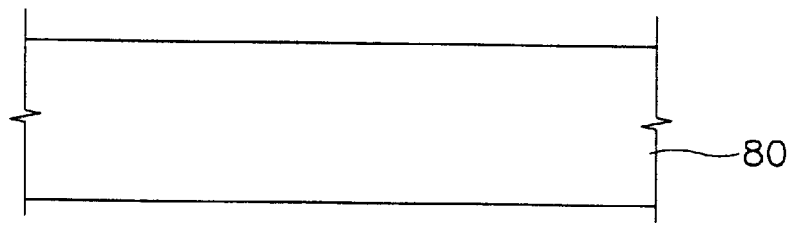
FIGS. 8A through 8D are cross-sectional views of a method of manufacturing an insulating layer according to a third embodiment of the present invention.
Figure 8B:
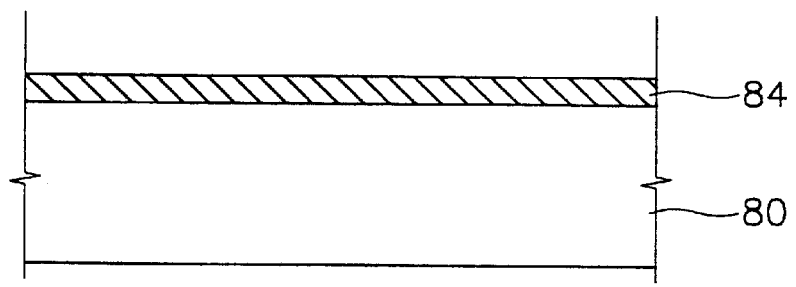

In FIG. 8A, a substrate 80 made of silicon material is provided. In FIG. 8B, an etch stop layer 84 is formed on the substrate 80. The etch stop layer 84 prevents the substrate 80 from damage caused by subsequent etching processes. In addition, the etch stop layer 84 also prevents an oxidation of the exposed substrate during subsequent patterning processes. It also prevents the penetration of moisture generated through a fluidal insulating layer and into the substrate. The moisture is generated when reflowing the fluidal insulating layer. The etch stop layer 84 is formed to a thickness of about 60–150 Å and is generally made of silicon nitride formed by a chemical vapor deposition method.

Figure 8C:
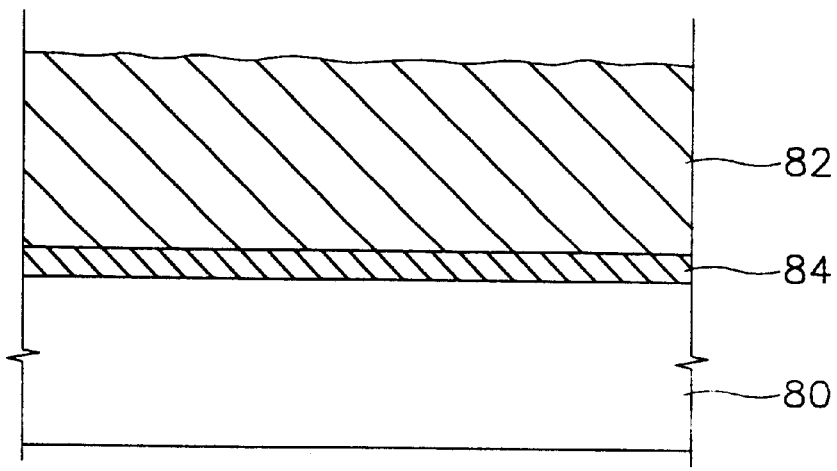

Referring to FIG. 8C, a BPSG layer is formed as a fluidal insulating layer 82 on the etch stop layer 84. The process of forming the BPSG layer will be described in detail below, and is similar to that described for the fluidal insulating layer 22 of the first embodiment.

First, the substrate 80 on which the etch stop layer 84 is formed, is positioned in the process chamber 30. Then, an oxygen gas having a flow rate of about 4,500 sccm, a nitrogen gas having a flow rate of about 3,000 sccm and a helium gas having a flow rate of about 4,000 sccm are provided into the process chamber 30, to create or form a gaseous atmosphere in the process chamber 30. In other words, a ratio of the oxygen gas flow rate, the nitrogen gas flow rate and the helium gas flow rate is about 1.00–2.50:0.70–0.95:1, with the helium gas flow rate being preferably 4,000 sccm.

The distance between the stage 200 on which the substrate 80 is positioned and the plate 230 is kept to about 500 mils (1 mil=25 μm) during this process. The formation of the gaseous atmosphere is a first step toward ensuring the uniformity of the fluidal insulating layer 82 to be formed on the etch stop layer 84.

This step of forming the gaseous atmosphere is controlled for a period of time not exceeding five seconds. If the formation of the gaseous atmosphere progresses for five seconds or more, it is judged as a process error.

After forming the gaseous atmosphere, the flow rate of the oxygen gas is increased to about 9,500 sccm, while the flow rates of the nitrogen gas (about 3,000 sccm) and the helium gas (about 4,000 sccm) remain the same, and all are provided into the process chamber 30. In other words, a ratio of the oxygen gas flow rate, the nitrogen gas flow rate and the helium gas flow rate is about 2.00–2.50:0.70–0.95:1, with the helium gas flow rate being preferably 4,000 sccm.

A processing pressure atmosphere is then formed in the process chamber 30 by utilizing a pumping apparatus (not shown) connected with the process chamber 30. This step of forming the pressurized atmosphere in the process chamber 30 is controlled for a period of time at a predetermined pressure. The maximum control time is sixty seconds and the minimum pressure is 160 Torr. If the formation of the pressurized atmosphere in the process chamber 30 progresses beyond 60 seconds or dips below 160 Torr, it is judged as a process error. The distance between the stage 200 on which the substrate 80 is positioned and the plate 230 is kept to about 500 mils. In addition, the temperature in the process chamber 30 kept at about 480° C.

After the pressurized atmosphere is formed, the flow rates of the oxygen gas (about 9,500 sccm), the nitrogen gas (about 3,000 sccm), and the helium gas (about 4,000 sccm) are maintained and provided into the process chamber 30, and then the pumping process is paused to stabilize the processing pressure atmosphere. This stabilizing step is controlled for a period of time, not to exceed 15 seconds. If the formation of the stabilized atmosphere progresses beyond fifteen seconds, it is judged as a process error. The distance between the stage 200 on which the substrate 80 is positioned and the plate 230 is decreased to about 220 mils, while the temperature in the process chamber 30 is maintained at about 480° C.

After the steps of forming the gaseous atmosphere, forming the pressurized atmosphere, and stabilization are completed, the step of forming the fluidal insulating layer 82 can commence.

During the step of forming the fluidal insulating layer, the flow rates of the oxygen gas (about 9,500 sccm), the nitrogen gas (about 3,000 sccm), and the helium gas (about 4,000 sccm) are maintained and provided into the process chamber 30. In addition, tetraorthosilicate (TEOS) having a flow rate of about 800 sccm, triethylborate (TEB) having a flow rate of about 170 sccm, and triethylphosphate (TEPO) having a flow rate of about 55 sccm, are provided into the process chamber 30. In other words, the ratio of the oxygen gas flow rate, the nitrogen gas flow rate, the helium gas flow rate, the TEOS flow rate, the TEB flow rate, and the TEPO flow rate is about 2.00–2.50:0.70–0.95:1:0.15–0.25:0.040–0.045:0.013–0.014, with the helium gas flow rate being preferably 4,000 sccm.

As a result, a BPSG layer is formed as a fluidal insulating layer 82 on the etch stop layer 84 in process chamber 30. At this time, the formation of the fluidal insulating layer 82 is controlled for a period of time, not to exceed 15 seconds. If the formation of the fluidal insulating layer 82 progresses beyond fifteen seconds, it is judged as a process error. The distance between the stage 200 on which the substrate 80 is positioned and the plate 230 is kept to about 220 mils, and the temperature in the process chamber 30 is maintained at about 480° C. Further, the process is controlled to form the fluidal insulating layer 82 to a thickness of about 8,000 to about 10,000 Å.

The classification of the gases and materials provided during the formation of the insulating layer 82 according to the third embodiment, has substantially the same attributes as in the first embodiment. Here, the functions and reactions of the oxygen gas, nitrogen gas, helium gas, tetraorthosilicate (TEOS), triethylborate (TEB), and triethylphosphate (TEPO) are substantially the same as described in the first embodiment. In addition, the alternative substituents for triethylborate and triethylphosphate, namely TMB and TMPO, respectively, also are the same. Note that in each of the steps, the oxygen gas has the highest flow rate, and the helium gas has a higher flow rate than the nitrogen gas.

The fluidal insulating layer 82, including about 5.5% by weight of boron and about 3.0% by weight of phosphorus, can be formed by controlling the flow rates of triethylborate which is supplied as the boron source, and triethylphosphate which is supplied as the phosphorus source. The reproducibility of the manufacturing process of the BPSG layer as the fluidal insulating layer 82 can be sufficiently established by controlling the flow rate of the carrier gas, the nitrogen gas and the helium gas. That is, when manufacturing the BPSG layer by utilizing a number of like apparatuses having the same elements, a BPSG layer having substantially the same characteristics can be obtained.

Figure 8D:
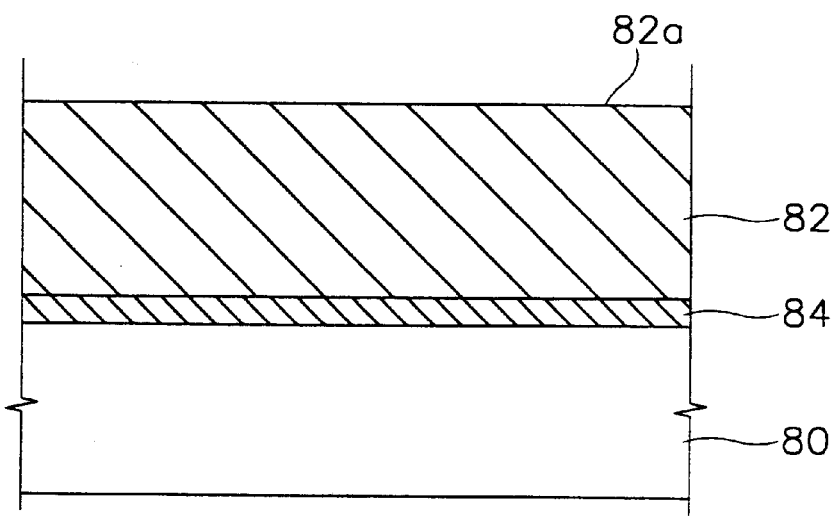

Referring to FIG. 8D, the fluidal insulating layer is reflowed at a high temperature while supplying an oxygen gas and a hydrogen gas to planarize the surface to form a planarized BPSG layer 82a. Accordingly, when manufacturing the BPSG layer with a number of like apparatuses having the same elements, a BPSG layer having substantially the same characteristic change after the reflowing process can be obtained. Accordingly, the reproducibility of the BPSG layer as the fluidal insulating layer 82 can be sufficiently established by implementing the above-described process.

Figure 9:
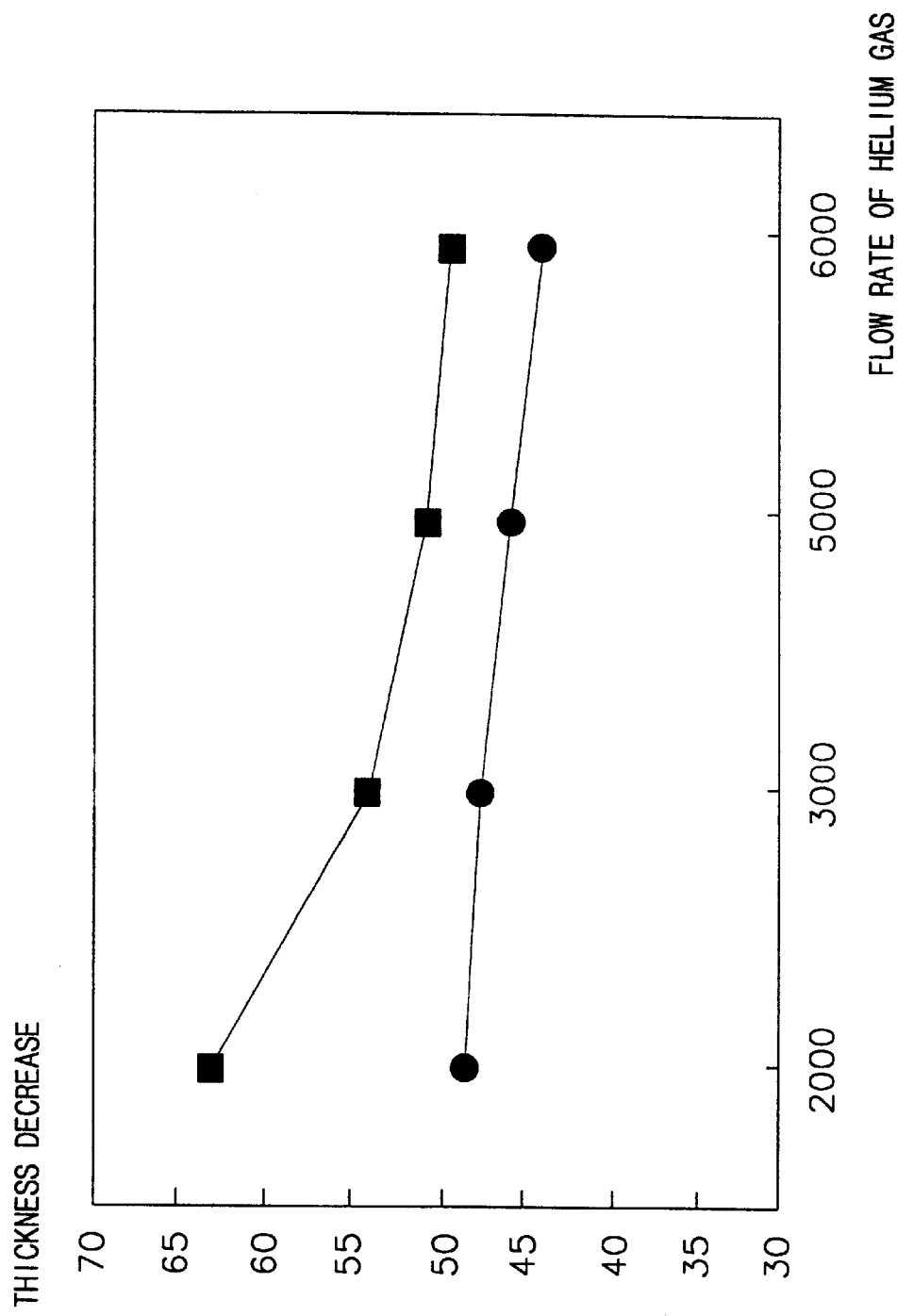
FIGS. 9 and 10 are graphs illustrating the thickness decrease of an etch stop layer according to a flow rate of a carrier gas.
Figure 10:
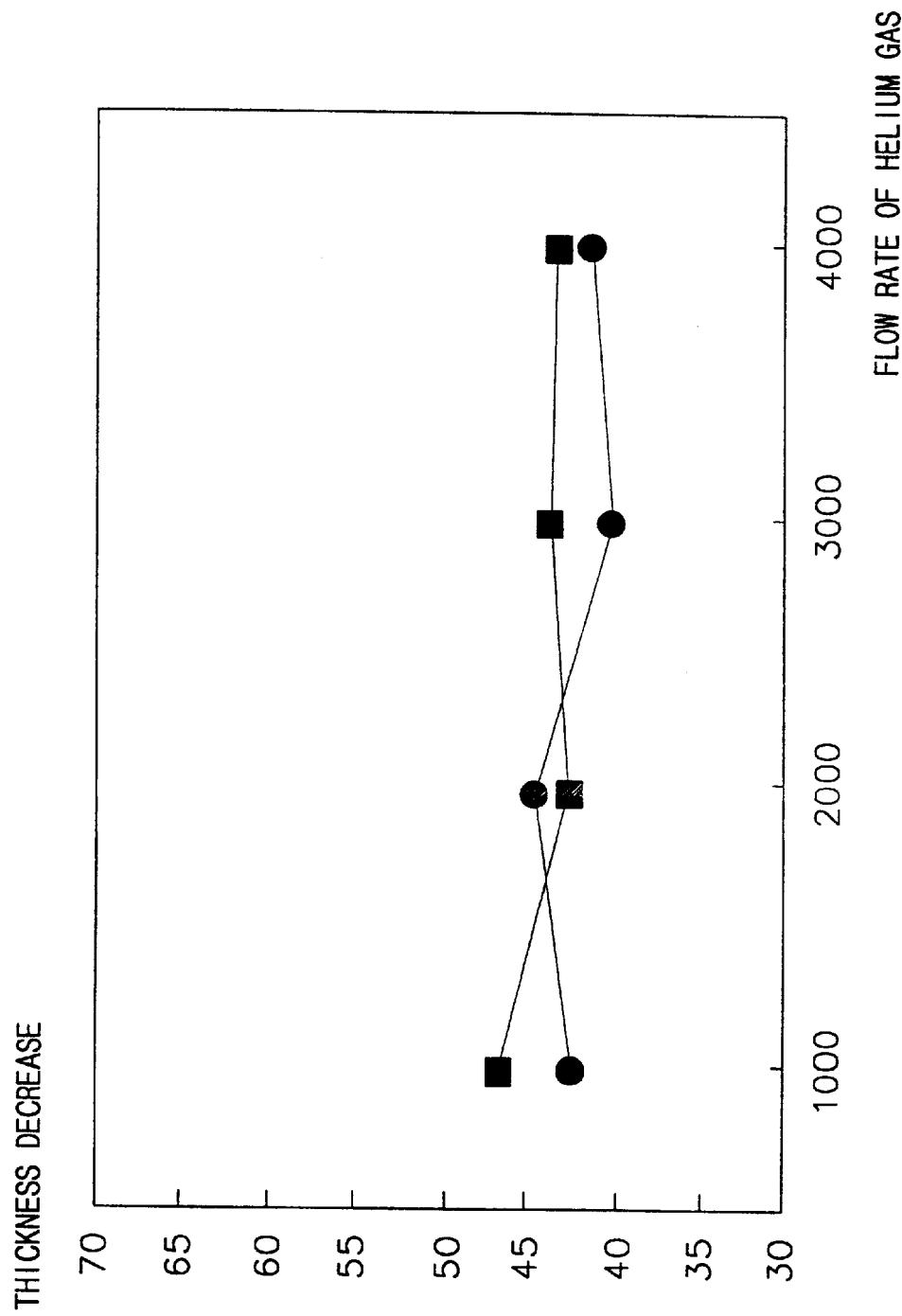

FIGS. 9 and 10 are graphs illustrating the decrease in the thickness of the etch stop layer with reference to various flow rates of a carrier gas after implementing the reflowing process according to the third embodiment of the present invention.

The graph in FIG. 9 was obtained by determining the decrease in the thickness of the etch stop layer when changing the flow rate of the helium gas as a carrier gas for controlling the concentration of phosphorus, while at the same time providing the nitrogen gas at a flow rate of 2,000 sccm as a carrier gas for controlling the concentration of boron. The decrease in the thickness of the etch stop layer was determined by measuring the thickness of the etch stop layer before and after implementing the reflowing of the BPSG layer, and the difference between the two measurements is shown in FIG. 9. The BPSG layer was formed by implementing the same process described in the third embodiment by utilizing two discrete, but equivalent, apparatus having the same elements.

In FIG. 9, the graph denoted by the symbol "■" corresponds to the case when forming the BPSG layer utilizing apparatus #1, and a graph denoted by symbol "●" corresponds to the case when forming the BPSG layer by utilizing apparatus #2. With reference to FIG. 9, by varying the flow rate of the helium gas as a carrier gas for controlling the concentration of phosphorus, while at the same time providing the nitrogen gas at a flow rate of 2,000 sccm as a carrier gas for controlling the concentration of boron, it can be seen that the decrease in the thickness of the etch stop layer deviates according to the particular apparatus utilized, which is an undesirable result.

The graph In FIG. 10 was obtained by determining the decrease in the thickness of the etch stop layer while changing the flow rate of the helium gas as a carrier gas for controlling the concentration of phosphorus, while at the same time providing the nitrogen gas at a flow rate of 3,000 sccm as a carrier gas for controlling the concentration of boron. The decrease in the thickness of the etch stop layer was determined, as before, by measuring the thickness of the etch stop layer before and after implementing the reflowing of the BPSG layer, and the difference between the two measurements is shown in FIG. 10. The BPSG layer was formed by implementing the same process described in the third embodiment by utilizing two discrete, but equivalent, apparatus having the same elements.

In FIG. 10, the graph denoted by the symbol "■" corresponds to the case when forming the BPSG layer utilizing apparatus #1, and a graph denoted by symbol "●" corresponds to the case when forming the BPSG layer by utilizing apparatus #2. With reference to FIG. 10, by varying the flow rate of the helium gas as a carrier gas for controlling the concentration of phosphorus, while at the same time providing the nitrogen gas at a flow rate of 3,000 sccm as a carrier gas for controlling the concentration of boron, it can be seen that the decrease in the thickness of the etch stop layer still deviates according to the particular apparatus utilized, except when the flow rate of the helium gas is about 4,000 sccm, where no deviation in the thickness of the etch stop layer was observed. Note also, that when the flow rate of the helium gas is 2,000 sccm, there is just a slight decrease in the thickness of the etch stop layer.

As confirmed in FIG. 10, the BPSG layers having substantially the same characteristics can be attained, even when utilizing different apparatuses, so long as the flow rate of the nitrogen gas was 3,000 sccm and that of the helium gas was either 2,000 sccm or 4,000 sccm. Accordingly, the reproducibility of the manufacture of the BPSG layer can be sufficiently established.

Although FIG. 10 is directed to BPSG layers formed by the process of the third embodiment, BPSG layers having substantially the same characteristics can be obtained when implementing the first and the second embodiments as well, when the nitrogen gas has a flow rate of 3,000 sccm and the helium gas has a flow rate of 2,000 sccm or 4,000 sccm. Therefore, with all the above described embodiments, a fluidal insulating layer having a sufficiently good filling effect and isotropic etching characteristic can be obtained. The decrease in the thickness of the etch stop layer underlying the fluidal insulating layer after implementing a reflowing process, is within a few angstroms (Å). In addition, fluidal insulating layers having substantially the same characteristics can be advantageously formed by utilizing separate but like apparatuses having the same elements.

FIGS. 11A through 11E are cross-sectional views for explaining a method of manufacturing an insulating layer according to a fourth embodiment of the present invention.

Figure 11A:
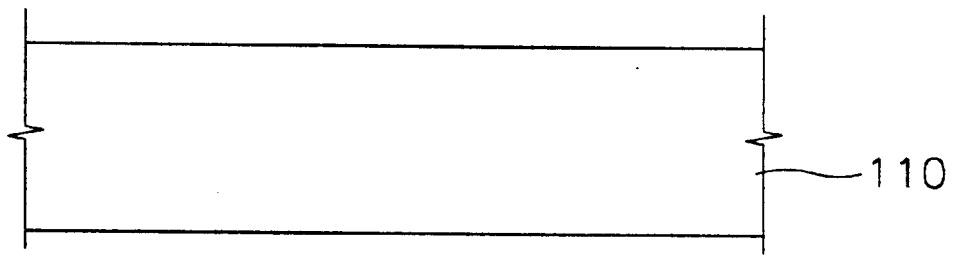
FIGS. 11A through 11E are cross-sectional views of a method of manufacturing an insulating layer according to a fourth embodiment of the present invention.
Figure 11B:
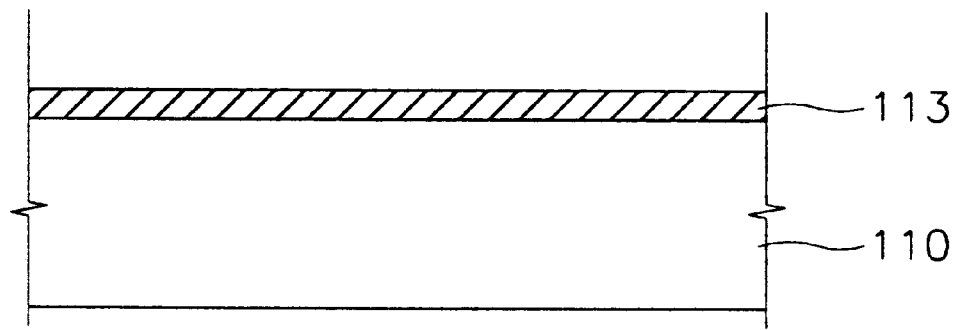

Referring to FIG. 11A, a substrate 110 made of silicon material is provided. An etch stop layer 113 is formed on the substrate 110 in FIG. 11B. The etch stop layer 113 is formed to a thickness of about 60–150 Å and is generally made of silicon nitride formed by a chemical vapor deposition method.

Figure 11C:
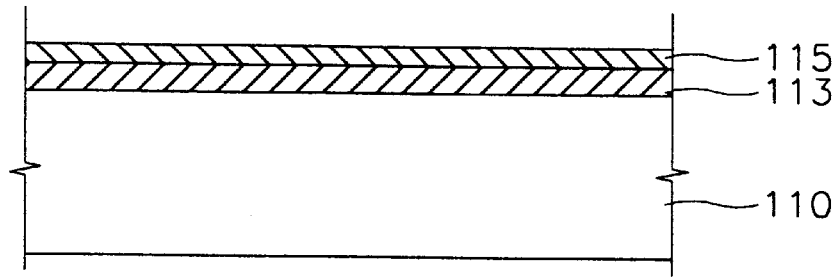

The manufacturing process of the insulating layer according to the fourth embodiment is implemented by utilizing an apparatus having the same elements as illustrated in FIGS. 3 and 4. Referring to FIG. 11C, the substrate 110 on which the etch stop layer 113 is formed, is positioned in the process chamber 30. Then, an oxygen gas having a flow rate of about 4,500 sccm, a nitrogen gas having a flow rate of about 3,000 sccm and a helium gas having a flow rate of about 4,000 sccm are provided into the process chamber 30, to thereby form a gaseous atmosphere in the process chamber 30. In other words, a ratio of the oxygen gas flow rate, the nitrogen gas flow rate and the helium gas flow rate is about 1.00–2.50:0.70–0.95:1, with the helium gas flow rate being preferably 4,000 sccm.

This step of forming the gaseous atmosphere is controlled for a period of time not exceeding five seconds. If the formation of the gaseous atmosphere progresses for five seconds or more, it is judged as a process error. The distance between the stage 200 on which the substrate 20 is positioned and the plate 230 is kept to about 500 mils (1 mil=25 μm) during this process.

After forming the gaseous atmosphere, the flow rate of the oxygen gas is increased to about 9,500 sccm, while the flow rates of the nitrogen gas (about 3,000 sccm) and the helium gas (about 4,000 sccm) remain the same, and all are provided into the process chamber 30. In other words, a ratio of the oxygen gas flow rate, the nitrogen gas flow rate and the helium gas flow rate is about 2.00–2.50:0.70–0.95:1, with the helium gas flow rate being preferably 4,000 sccm.

A processing pressure atmosphere is then formed in the process chamber 30 by utilizing a pumping apparatus (not shown) connected with the process chamber 30. This step of forming the pressurized atmosphere in the process chamber 30 is controlled for a period of time at a predetermined pressure. The maximum control time is sixty seconds and the minimum pressure is 160 Torr. If the formation of the pressurized atmosphere in the process chamber 30 progresses beyond 60 seconds or dips below 160 Torr, it is judged as a process error. The distance between the stage 200 on which the substrate 20 is positioned and the plate 230 is kept to about 500 mils. In addition, the temperature in the process chamber 30 kept at about 480° C.

After the pressurized atmosphere is formed, the flow rates of the oxygen gas (about 9,500 sccm), the nitrogen gas (about 3,000 sccm), and the helium gas (about 4,000 sccm) are maintained and provided into the process chamber 30, and then the pumping process is paused to stabilize the processing pressure atmosphere. This stabilizing step is controlled for a period of time, not to exceed 15 seconds. If the formation of the stabilized atmosphere progresses beyond fifteen seconds, it is judged as a process error. The distance between the stage 200 on which the substrate 20 is positioned and the plate 230 is decreased to about 220 mils, while the temperature in the process chamber 30 is maintained at about 480° C.

After the steps of forming the gaseous atmosphere, forming the pressurized atmosphere, and stabilization are completed, a fluidal insulating layer 115 is formed on the etch stop layer 113. The fluidal insulating layer 115 is not doped and is formed in the apparatus of FIGS. 3 and 4 as follows.

The oxygen gas having a flow rate of about 9,500 sccm, the nitrogen gas having a flow rate of about 3,000 sccm and the helium gas having a flow rate of about 4,000 sccm are provided into the process chamber 30. In addition, tetraorthosilicate (TEOS) having a flow rate of about 800 sccm is provided into the process chamber 30 as a silicon source, and the undoped fluidal insulating layer 115 is formed on the etch stop layer 113. In other words, the ratio of the oxygen gas flow rate, the nitrogen gas flow rate, the helium gas flow rate, and the TEOS flow rate, is about 2.00–2.50:0.70–0.95:1:0.15–0.25, with the helium gas flow rate being preferably 4,000 sccm.

This step of forming the undoped fluidal insulating layer 115 is controlled for a period of time not exceeding three seconds, and if the step progresses for three seconds or more, it is judged as a process error. The distance between the stage 200 on which the substrate 110 is positioned and the plate 230 is kept to about 220 mils. In addition, the temperature in the process chamber 30 is maintained at about 480° C. Further, the process is controlled to form the undoped fluidal insulating layer 115 to a thickness of about 30 to about 50 Å.

Figure 11D:
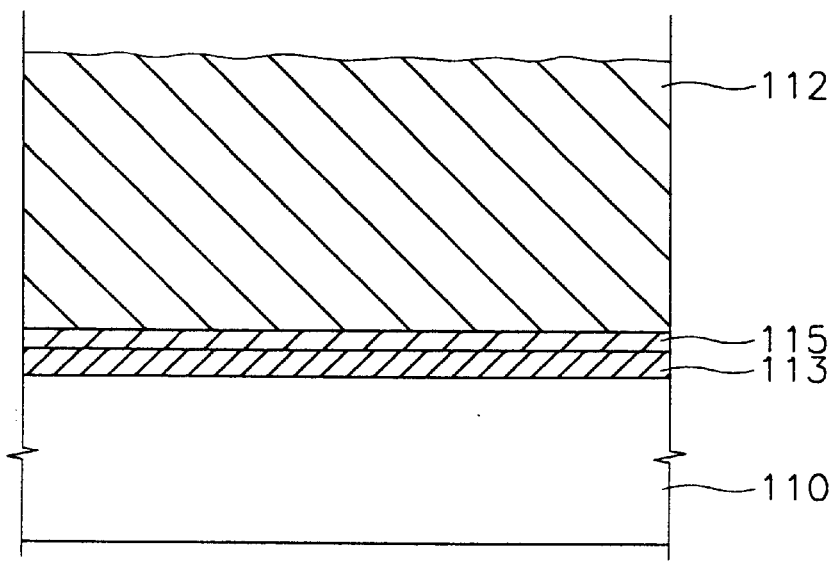

Referring to FIG. 11D, a BPSG layer 112 is formed on the undoped fluidal insulating layer 115 in accordance with the following process. During the step of forming the BPSG layer 112, the flow rates of the oxygen gas (about 9,500 sccm), the nitrogen gas (about 3,000 sccm), and the helium gas (about 4,000 sccm) are maintained and provided into the process chamber 30. In addition, tetraorthosilicate (TEOS) having a flow rate of about 800 sccm, triethylborate (TEB) having a flow rate of about 170 sccm, and triethylphosphate (TEPO) having a flow rate of about 55 sccm, are provided into the process chamber 30. In other words, the ratio of the oxygen gas flow rate, the nitrogen gas flow rate, the helium gas flow rate, the TEOS flow rate, the TEB flow rate, and the TEPO flow rate is about 2.00–2.50:0.70–0.95:1:0.15–0.25:0.040–0.045:0.013–0.014, with the helium gas flow rate being preferably 4,000 sccm.

As a result, a BPSG layer 112 is formed on the undoped fluidal insulating layer 115 in process chamber 30. At this time, the formation of the BPSG layer 112 is controlled for a period of time, not to exceed 15 seconds. If the formation of the BPSG layer 112 progresses beyond fifteen seconds, it is judged as a process error. The distance between the stage 200 on which the substrate 110 is positioned and the plate 230 is kept to about 220 mils, and the temperature in the process chamber 30 is maintained at about 480° C. Further, the process is controlled to form the BPSG layer 112 to a thickness of about 8,000 to about 10,000 Å.

The classification of the gases and materials provided during the formation of the BPSG layer 112 according to the fourth embodiment, has substantially the same constitution as in the first embodiment. Here, the functions and reactions of the oxygen gas, nitrogen gas, helium gas, tetraorthosilicate (TEOS), triethylborate (TEB), and triethylphosphate (TEPO) are substantially the same as described in the first embodiment. In addition, the alternative substituents for triethylborate and triethylphosphate, namely TMB and TMPO, respectively, also are the same. Note that in each of the steps, the oxygen gas has the highest flow rate, and the helium gas has a higher flow rate than the nitrogen gas.

Figure 11E:
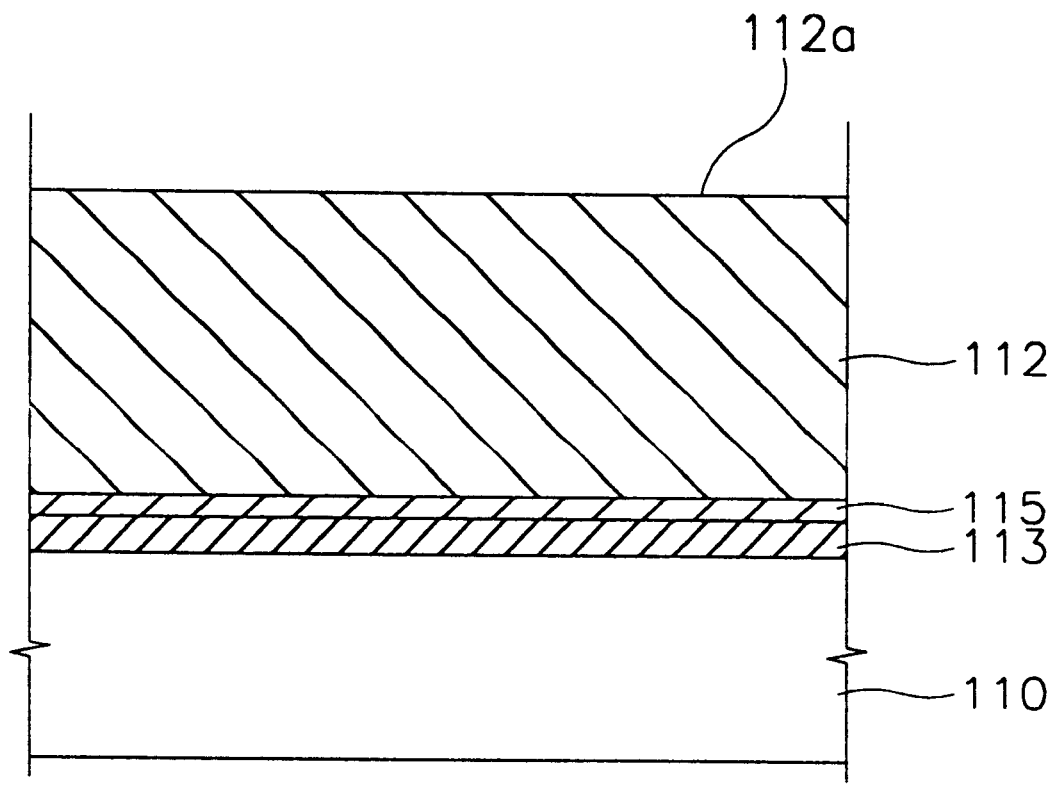

Referring to FIG. 11E, the BPSG layer 112 is reflowed at a high temperature while supplying an oxygen gas and a hydrogen gas to planarize the surface to form a planarized BPSG layer 112a. Accordingly, when manufacturing the BPSG layer with a number of separate but like apparatuses having the same elements, a BPSG layer having substantially the same characteristic change after the reflowing process can be obtained. Accordingly, the reproducibility of the BPSG layer can be sufficiently established by implementing the above-described process.

The insulating layers manufactured by the above-described embodiments can be applied to a semiconductor device having a design rule of 0.15 μm or less. That is, the BPSG layer can be applied as the fluidal insulating layer for the manufacture of a self-aligned contact hole, or the manufacture of an intermediate dielectric such as an inter metal dielectric (IMD) or an inter layer dielectric (ILD), and the like.

FIGS. 12A through 12E are cross-sectional views for explaining a method of manufacturing a semiconductor device according to a fifth embodiment of the present invention.

Figure 12A:
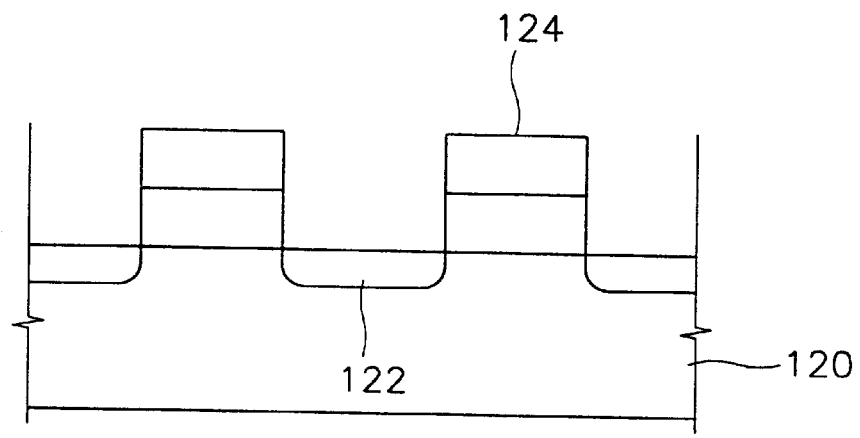
FIGS. 12A through 12E are cross-sectional views of a method of manufacturing a semiconductor device according to a fifth embodiment of the present invention.

Referring to FIG. 12A, gate electrodes 124 are formed on a substrate 120 on which a source and drain 122 are formed. The source and drain 122 is formed by doping an impurity into the substrate 120, and the gate electrode 124 is formed by sequentially forming a polysilicon layer and a tungsten silicide layer and implementing conventional photolithography processes.

Figure 12B:
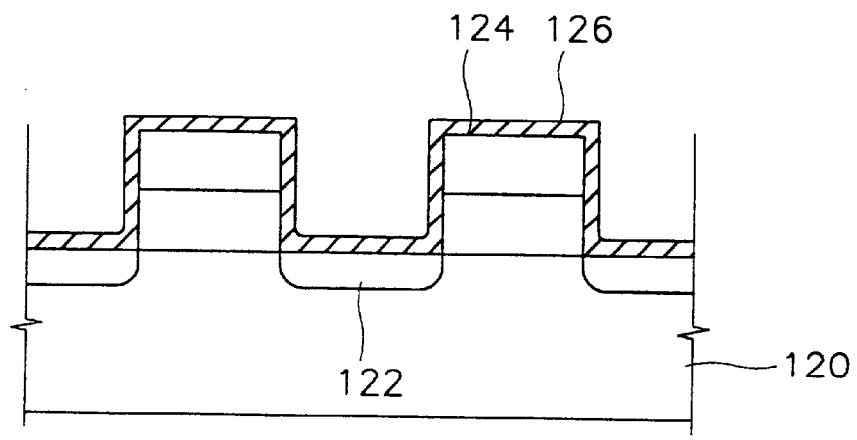

Referring to FIG. 12B, an etch stop layer 126 composed of silicon nitride is formed on the substrate 120 and the gate electrode 124. The etch stop layer 126 is formed to a thickness of about 60–150 Å by means of a chemical vapor deposition method. The silicon nitride layer prevents damage to the substrate 120 that could have been caused by subsequent etching processes, as well as preventing oxidation of the substrate 120 due to exposure of the substrate 120. Moreover, the etch stop layer 126 prevents moisture from penetrating to the substrate 120 during a reflowing process.

Figure 12C:
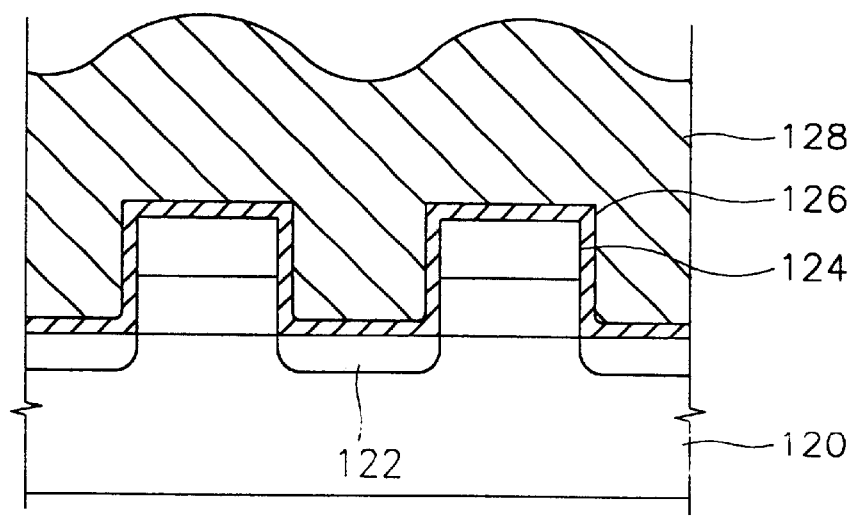

Referring to FIG. 12C, a BPSG layer 128 is formed on the etch stop layer 126 as a fluidal insulating layer. At this time, the BPSG layer 128 is formed so as to include about 5.5% by weight of boron and about 3.0% by weight of phosphorus. The thickness of the BPSG layer 128 is about 9,500 Å.

The manufacturing process of the BPSG layer 128 as the fluidal insulating layer will be described in detail below. The fluidal insulating layer is formed by an apparatus having the same elements as illustrated in FIGS. 3 and 4.

First, the substrate 120 on which the etch stop layer 126 is formed, is positioned in the process chamber 30. Then, an oxygen gas having a flow rate of about 4,500 sccm, a nitrogen gas having a flow rate of about 3,000 sccm and a helium gas having a flow rate of about 4,000 sccm are provided into the process chamber 30, to create or form a gaseous atmosphere in the process chamber 30. In other words, a ratio of the oxygen gas flow rate, the nitrogen gas flow rate and the helium gas flow rate is about 1.00–2.50:0.70–0.95:1, with the helium gas flow rate being preferably 4,000 sccm.

The distance between the stage 200 on which the substrate 120 is positioned and the plate 230 is kept to about 500 mils (1 mil=25 μm) during this process. The formation of the gaseous atmosphere is a first step toward ensuring the uniformity of the fluidal insulating layer to be formed on the etch stop layer 126.

This step of forming the gaseous atmosphere is controlled for a period of time not exceeding five seconds. If the formation of the gaseous atmosphere progresses for five seconds or more, it is judged as a process error.

After forming the gaseous atmosphere, the flow rate of the oxygen gas is increased to about 9,500 sccm, while the flow rates of the nitrogen gas (about 3,000 sccm) and the helium gas (about 4,000 sccm) remain the same, and all are provided into the process chamber 30. In other words, a ratio of the oxygen gas flow rate, the nitrogen gas flow rate and the helium gas flow rate is about 2.00–2.50:0.70–0.95:1, with the helium gas flow rate being preferably 4,000 sccm.

A processing pressure atmosphere is then formed in the process chamber 30 by utilizing a pumping apparatus (not shown) connected with the process chamber 30. This step of forming the pressurized atmosphere in the process chamber 30 is controlled for a period of time at a predetermined pressure. The maximum control time is sixty seconds and the minimum pressure is 160 Torr. If the formation of the pressurized atmosphere in the process chamber 30 progresses beyond 60 seconds or dips below 160 Torr, it is judged as a process error. The distance between the stage 200 on which the substrate 120 is positioned and the plate 230 is kept to about 500 mils. In addition, the temperature in the process chamber 30 kept at about 480° C.

After the pressurized atmosphere is formed, the flow rates of the oxygen gas (about 9,500 sccm), the nitrogen gas (about 3,000 sccm), and the helium gas (about 4,000 sccm) are maintained and provided into the process chamber 30, and then the pumping process is paused to stabilize the processing pressure atmosphere. This stabilizing step is controlled for a period of time, not to exceed 15 seconds. If the formation of the stabilized atmosphere progresses beyond fifteen seconds, it is judged as a process error. The distance between the stage 200 on which the substrate 120 is positioned and the plate 230 is decreased to about 220 mils, while the temperature in the process chamber 30 is maintained at about 480° C.

After the steps of forming the gaseous atmosphere, forming the pressurized atmosphere, and stabilization are completed, the step of forming the fluidal insulating layer can commence.

During the step of forming the fluidal insulating layer, the flow rates of the oxygen gas (about 9,500 sccm), the nitrogen gas (about 3,000 sccm), and the helium gas (about 4,000 sccm) are maintained and provided into the process chamber 30. In addition, tetraorthosilicate (TEOS) having a flow rate of about 800 sccm, triethylborate (TEB) having a flow rate of about 170 sccm, and triethylphosphate (TEPO) having a flow rate of about 55 sccm, are provided into the process chamber 30. In other words, the ratio of the oxygen gas flow rate, the nitrogen gas flow rate, the helium gas flow rate, the TEOS flow rate, the TEB flow rate, and the TEPO flow rate is about 2.00–2.50:0.70–0.95:1:0.15–0.25:0.040–0.045:0.013–0.014, with the helium gas flow rate being preferably 4,000 sccm.

As a result, a BPSG layer 128 is formed as a fluidal insulating layer on the etch stop layer 126 in process chamber 30. At this time, the formation of the BPSG layer 128 is controlled for a period of time, not to exceed 15 seconds. If the formation of the BPSG layer 128 progresses beyond fifteen seconds, it is judged as a process error. The distance between the stage 200 on which the substrate 120 is positioned and the plate 230 is kept to about 220 mils, and the temperature in the process chamber 30 is maintained at about 480° C. Further, the process is controlled to form the BPSG layer 128 to a thickness of about 9,500 Å.

The classification of the gases and materials provided during the formation of the BPSG layer 128 according to this embodiment, has substantially the same constitution as in the first embodiment. Here, the functions and reactions of the oxygen gas, nitrogen gas, helium gas, tetraorthosilicate (TEOS), triethylborate (TEB), and triethylphosphate (TEPO) are substantially the same as described in the first embodiment. In addition, the alternative substituents for triethylborate and triethylphosphate, namely TMB and TMPO, respectively, also are the same. Note that in each of the steps, the oxygen gas has the highest flow rate, and the helium gas has a higher flow rate than the nitrogen gas.

The BPSG layer 128, including about 5.5% by weight of boron and about 3.0% by weight of phosphorus, can be formed by controlling the flow rates of triethylborate which is supplied as the boron source, and triethylphosphate which is supplied as the phosphorus source. The reproducibility of the manufacturing process of the BPSG layer 128 can be sufficiently established by controlling the flow rate of the carrier gas, the nitrogen gas and the helium gas. That is, when manufacturing the BPSG layer by utilizing a number of apparatuses having the same elements, a BPSG layer having substantially the same characteristics can be obtained.

Figure 12D:
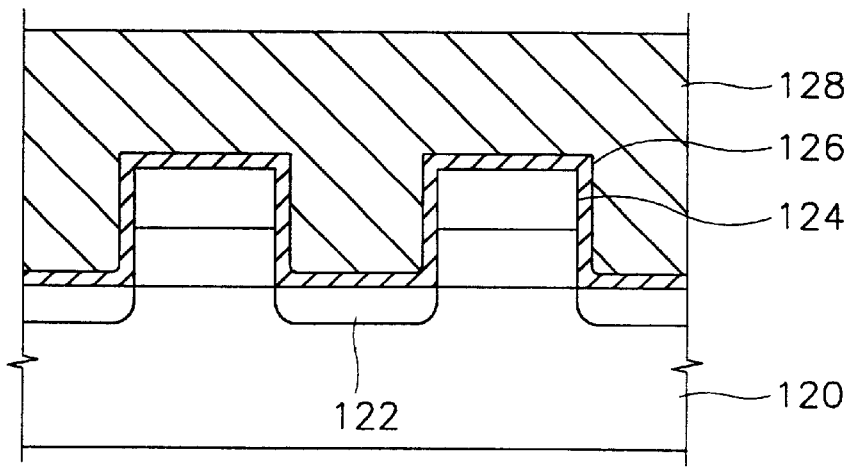

Referring to FIG. 12D, the BPSG layer 128 is reflowed at a temperature of about 850° C., while supplying an oxygen gas and a hydrogen gas. Then, the surface of the BPSG layer 128 is planarized to form planarized BPSG layer 128a, and the BPSG sufficiently flows into the recessed portions formed between the gate electrodes 124. This effect is obtained because the BPSG layer comprises 5.5% by weight of boron and 3.0% by weight of phosphorus. Accordingly, a sufficient filling effect can be accomplished and any appreciable decrease in the thickness of an underlying etch stop layer 126 is prevented.

In addition, as described above, preferably the BPSG layer 128 is manufactured by utilizing about 3,000 sccm of the nitrogen gas and about 4,000 sccm of the helium gas as the carrier gases. Accordingly, when manufacturing the BPSG layer 128 by utilizing a number of discrete apparatuses having the same elements, substantially the same processing characteristic can be obtained, thereby ensuring the reproducibility and stability of the BPSG layer 128.

Figure 12E:
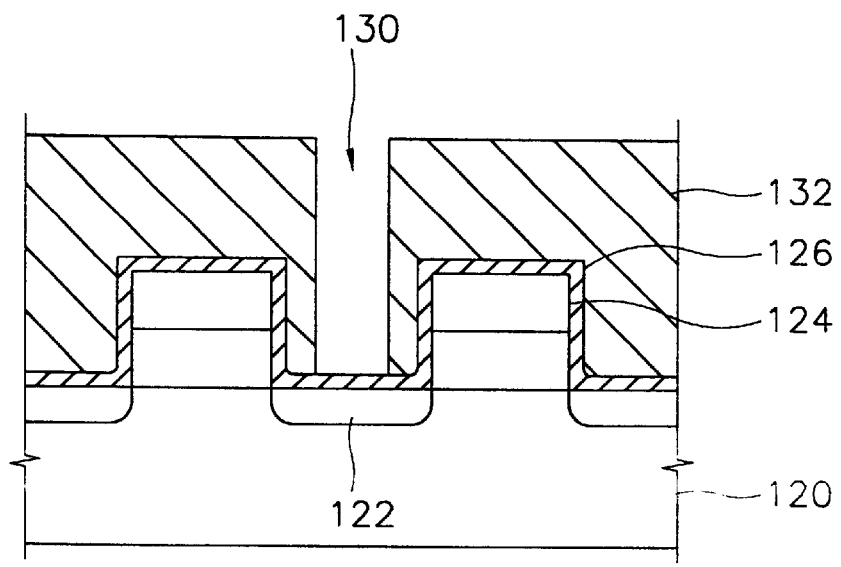

Referring to FIG. 12E, by implementing a self-aligned contact process, a pattern 132 having a hole 130 is formed. The hole 130 is formed by conventional photolithography and the etching techniques performed on the BPSG layer 128, utilizing an etching gas including CFx (wherein C is carbon, F is fluorine and x is a positive number). The etching is carried out by utilizing an etching selectivity of the BPSG layer 128 and the underlying etch stop layer 126. Since almost no change in thickness is observed on the etch stop layer 126, the etch stop function can be advantageously implemented. In addition, because of the etch stop layer 126, a sufficient shoulder margin can be attained during the implementation of the self-aligned contact process. Accordingly, when a subsequent process is implemented by utilizing a metal layer for filling the hole 130 for example, the hole 130 can be sufficiently filled with the metal layer.

As described above, since recently formed semiconductor devices include minute elevated and recessed portions formed by the gate electrodes 124, it is not an easy task to satisfactorily fill the insulating layer between the recessed portions formed between the gate electrodes 124. Accordingly, a fluidal insulating layer having a sufficient fluidity is utilized to fill the recessed portions between the gate electrodes. The elevated and recessed portions are not limited to those formed between the gate electrodes 124 but includes any portions formed by patterns including windows.

Figure 13:
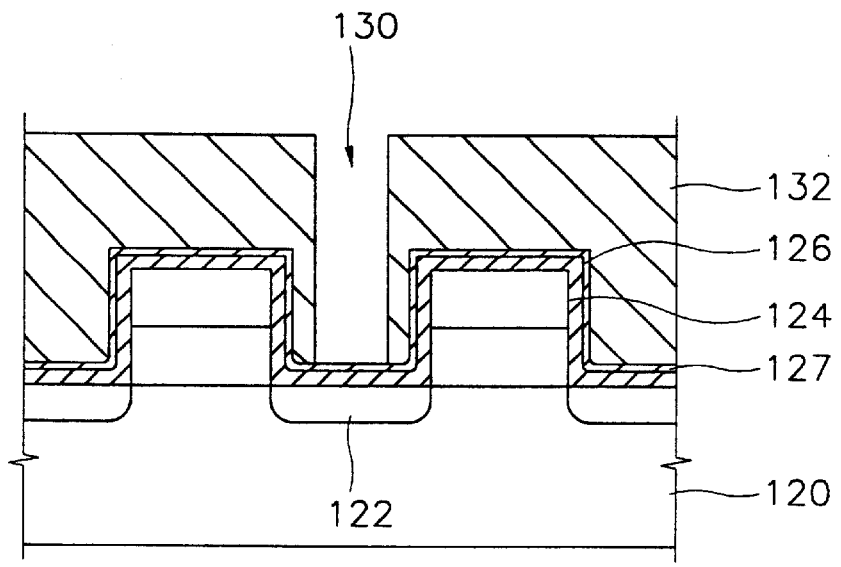
FIG. 13 is a cross-sectional view of a semiconductor device manufactured by a sixth embodiment of the present invention.

FIG. 13 is a cross-sectional view for explaining a semiconductor device manufactured by a sixth embodiment of the present invention. In this embodiment, an additional step of forming an undoped fluidal insulating layer is performed after the formation of the etch stop layer. In this case, the undoped fluidal insulating layer is formed on the etch stop layer, and a BPSG layer is formed on the undoped fluidal insulating layer.

More specifically, referring to FIG. 13, an etch stop layer 126 is formed and a process atmosphere is formed. Then, an undoped fluidal insulating layer 127 is formed and a BPSG layer into which phosphorus and boron are doped, is formed.

The undoped fluidal insulating layer 127 is formed by the following process. After forming the process atmosphere, the oxygen gas having a flow rate of about 9,500 sccm, the nitrogen gas having a flow rate of about 3,000 sccm and the helium gas having a flow rate of about 4,000 sccm are provided into the process chamber 30. In addition, tetraorthosilicate (TEOS) having a flow rate of about 800 sccm is provided into the process chamber 30 as a silicon source, and the undoped fluidal insulating layer 127 is formed on the etch stop layer 126. In other words, the ratio of the oxygen gas flow rate, the nitrogen gas flow rate, the helium gas flow rate, and the TEOS flow rate, is about 2.00–2.50:0.70–0.95:0.15–0.25, with the helium gas flow rate being preferably 4,000 sccm.

This step of forming the undoped fluidal insulating layer 127 is controlled for a period of time not exceeding three seconds, and if the step progresses for three seconds or more, it is judged as a process error. The distance between the stage 200 on which the substrate 120 is positioned and the plate 230 is kept to about 220 mils. In addition, the temperature in the process chamber 30 is maintained at about 480° C. Further, the process is controlled to form the undoped fluidal insulating layer 127 to a thickness of about 30 to about 50 Å. The undoped fluidal insulating layer 127 functions as a buffer as described previously.

As described above, any layer characteristic changes due to the reflowing process can be minimized by forming an insulating layer having sufficient fluidity by controlling the amount of boron and phosphorus included therein. Moreover, the decrease in the thickness of an underlying etch stop layer, caused by the reflowing process of the fluidal insulating layer, can be minimized, and a sufficient filling effect and isotropic effect can be attained via the same process. In addition, process reproducibility across like apparatuses can be sufficiently established by controlling the flow rate of carrier gasses during the formation of the fluidal insulating layer. Accordingly, the fluidal insulating layers having substantially the same characteristic change can be manufactured, regardless of the discrete apparatus that is used.

Therefore, in accordance with the present invention, the characteristic change due to the reflowing process is minimized and the reproducibility of the fluidal insulating layer across like apparatuses is established, leading to improved semiconductor device performance. Further, since the fluidal insulating layer is formed through a process without first forming a seed layer, the manufacturing process is simplified, thereby improving production efficiency.

While the present invention is described in detail referring to the above embodiments, various modifications, alternate constructions and equivalents may be employed without departing from the true spirit and scope of the present invention as defined in the appended claims.

What is claimed is:

1. A method of manufacturing an insulating layer comprising:
    creating a process atmosphere in a chamber for forming a fluidal insulating layer by (a) flowing an oxidizing gas at an oxidizing gas flow rate for forming an oxidizing atmosphere, (b) flowing a first carrier gas at a first carrier gas flow rate, and (c) flowing a second carrier gas at a second carrier gas flow rate, the second carrier gas flow rate being greater than the first carrier gas flow rate; and
    forming the fluidal insulating layer on a substrate positioned in the chamber by (d) flowing the oxidizing gas at the oxidizing gas flow rate, (e) flowing the first carrier gas at the first carrier gas flow rate while carrying a first impurity including boron flowing at a first impurity flow rate, (f) flowing the second carrier gas at the second carrier gas flow rate while carrying a second impurity including phosphorus flowing at a second impurity flow rate, the second carrier gas flow rate being greater than the first carrier gas flow rate, and (g) flowing a silicon source material at a silicon source flow rate.

2. A method of manufacturing an insulating layer as claimed in claim 1, wherein during the creating and forming steps, the oxidizing gas is one selected from a group consisting of oxygen gas, ozone gas and a mixture thereof, the first carrier gas is a nitrogen gas, the second carrier gas is a helium gas, the silicon source material is tetraethylorthosilicate (TEOS), the first impurity is one selected from a group consisting of triethylborate (TEB), trimethylborate (TMB), and a mixture thereof, and the second impurity is one selected from a group consisting of triethylphosphate (TEPO), trimethylphosphate (TMPO) and a mixture thereof.

3. A method of manufacturing an insulating layer as claimed in claim 1, wherein for the forming of the process atmosphere, a ratio of the oxidizing gas flow rate, the first carrier gas flow rate, and the second carrier gas flow rate is about 1.00–2.50:0.70–0.95:1.

4. A method of manufacturing an insulating layer as claimed in claim 3, wherein the second carrier gas flow rate is at least 4,000 sccm.

5. A method of manufacturing an insulating layer as claimed in claim 1, wherein for the forming of the fluidal insulating layer, a ratio of the oxidizing gas flow rate, the first carrier gas flow rate, the second carrier gas flow rate, the silicon source flow rate, the first impurity flow rate, and the second impurity flow rate is about 2.00–2.50:0.70–0.95:1:0.15–0.25:0.040–0.045:0.013–0.014.

6. A method of manufacturing an insulating layer as claimed in claim 5, wherein the second carrier gas flow rate is at least 4,000 sccm.

7. A method of manufacturing an insulating layer as claimed in claim 1, further comprising forming an etch stop layer on the substrate prior to forming the fluidal insulating layer.

8. A method of manufacturing an insulating layer as claimed in claim 1, wherein before forming the fluidal insulating layer, further comprising forming an undoped fluidal insulating layer on the substrate, and wherein for forming the undoped fluidal insulating layer, the ratio of the oxidizing gas flow rate, the first carrier gas flow rate, the second carrier gas flow rate, and the silicon source flow rate is about 2.00–2.50:0.70–0.95:1:0.15–0.25.

9. A method of manufacturing an insulating layer as claimed in claim 8, wherein the second carrier gas flow rate is at least 4,000 sccm.

10. A method of manufacturing an insulating layer as claimed in claim 8, wherein the undoped fluidal insulating layer is formed within about three seconds.

11. A method of manufacturing an insulating layer as claimed in claim 1, further comprising reflowing the fluidal insulating layer after the forming thereof.

12. A method of manufacturing an insulating layer as claimed in claim 1, wherein the creating of the process atmosphere in the chamber includes,
    flowing the oxidizing gas, the first carrier gas, and the second carrier gas in the chamber in a flow rate ratio of about 1.00–1.25:0.70–0.95:1;
    forming a pressurized atmosphere in the chamber utilizing a pumping apparatus communicating with the chamber, while flowing the oxidizing gas, the first carrier gas, and the second carrier gas in the chamber in a flow rate ratio of about 2.00–2.50:0.70–0.95:1; and
    stabilizing the pressurized atmosphere formed in the chamber by flowing the oxidizing gas, the first carrier gas, and the second carrier gas in the chamber in a flow rate ratio of about 2.00–2.50:0.70–0.95:1.

13. A method of manufacturing an insulating layer as claimed in claim 12, wherein the flowing continues for less than five seconds, the forming a pressurized atmosphere continues for less than 60 seconds at a pressure of at least 160 Torr, and the stabilizing continues for less than fifteen seconds.

14. A method of manufacturing an insulating layer as claimed in claim 1, wherein the fluidal insulating layer is formed within fifteen seconds.

15. A method of manufacturing a semiconductor device comprising:
    forming an etch stop layer on a substrate positioned in a chamber;
    creating a process atmosphere in the chamber for forming a fluidal insulating layer by (a) flowing an oxidizing gas at an oxidizing gas flow rate for forming an oxidizing atmosphere, (b) flowing a first carrier gas at a first carrier gas flow rate, and (c) flowing a second carrier gas at a second carrier gas flow rate, the second carrier gas flow rate being greater than the first carrier gas flow rate;
    forming a fluidal insulating layer on the etch stop layer by (d) flowing the oxidizing gas at the oxidizing gas flow rate, (e) flowing the first carrier gas at the first carrier gas flow rate while carrying a first impurity including boron flowing at a first impurity flow rate, (f) flowing the second carrier gas at the second carrier gas flow rate while carrying a second impurity including phosphorus flowing at a second impurity flow rate, the second carrier gas flow rate being greater than the first carrier gas flow rate, and (g) flowing a silicon source material at a silicon source flow rate;
    reflowing the fluidal insulating layer utilizing oxygen gas and hydrogen gas to planarize an upper surface of the fluidal insulating layer and to fill recessed portions on the substrate with the fluidal insulating layer; and
    forming a pattern having a window in the fluidal insulating layer for exposing a surface of the etch stop layer by etching a predetermined portion of the fluidal insulating layer.

16. A method of manufacturing a semiconductor device as claimed in claim 15, wherein the etch stop layer comprises silicon nitride and is formed to a thickness of about 60–150 Å.

17. A method of manufacturing a semiconductor device as claimed in claim 15, wherein the oxidizing gas is one selected from a group consisting of oxygen gas, ozone gas and a mixture thereof, the first carrier gas is a nitrogen gas, the second carrier gas is a helium gas, and wherein ratio of the oxidizing gas flow rate, the first carrier gas flow rate, and the second carrier gas flow rate is about 1.00–2.50:0.70–0.95:1.

18. A method of manufacturing a semiconductor device as claimed in claim 17, wherein the second carrier gas flow rate is at least 4,000 sccm.

19. A method of manufacturing a semiconductor device as claimed in claim 17, wherein the creating of the process atmosphere in the chamber includes, flowing the oxidizing gas, the first carrier gas, and the second carrier gas in the chamber in a flow rate ratio of about 1.00–1.25:0.70–0.95:1;

forming a pressurized atmosphere in the chamber utilizing a pumping apparatus communicating with the chamber, while flowing the oxidizing gas, the first carrier gas, and the second carrier gas in the chamber in a flow rate ratio of about 2.00–2.50:0.70–0.95:1; and stabilizing the pressurized atmosphere formed in the chamber by flowing the oxidizing gas, the first carrier gas, and the second carrier gas in the chamber in a flow rate ratio of about 2.00–2.50:0.70–0.95:1.

20. A method of manufacturing a semiconductor device as claimed in claim 19, wherein the flowing continues for less than five seconds, the forming a pressurized atmosphere continues for less than 60 seconds at a pressure of at least 160 Torr, and the stabilizing continues for less than fifteen seconds.

21. A method of manufacturing a semiconductor device as claimed in claim 15, wherein during the creating and forming steps, the oxidizing gas is one selected from a group consisting of oxygen gas, ozone gas and a mixture thereof, the first carrier gas is a nitrogen gas, the second carrier gas is a helium gas, the silicon source material is tetraethylorthosilicate (TEOS), the first impurity is one selected from a group consisting of triethylborate (TEB), trimethylborate (TM B), and a mixture thereof, and the second impurity is one selected from a group consisting of triethylphosphate (TEPO), trimethylphosphate (TMPO) and a mixture thereof.

22. A method of manufacturing a semiconductor device as claimed in claim 21, wherein for the forming of the fluidal insulating layer, a ratio of the oxidizing gas flow rate, the first carrier gas flow rate, the second carrier gas flow rate, the silicon source flow rate, the first impurity flow rate, and the second impurity flow rate is about 2.00–2.50:0.70–0.95:1:0.15–0.25:0.040–0.045:0.013–0.014.

23. A method of manufacturing a semiconductor device as claimed in claim 22, wherein the second carrier gas flow rate is at least 4,000 sccm.

24. A method of manufacturing a semiconductor device as claimed in claim 23, wherein the fluidal insulating layer is formed to a thickness of about 8,000–10,000 Å within fifteen seconds.

25. A method of manufacturing a semiconductor device as claimed in claim 15, wherein the pattern having the window is formed by etching the fluidal insulating layer by utilizing an etching gas including CFx.

26. A method of manufacturing a semiconductor device as claimed in claim 15, wherein before forming the fluidal insulating layer, further comprising forming an undoped fluidal insulating layer the substrate, and wherein for the forming of the undoped fluidal insulating layer, the ratio of the oxidizing gas flow rate, the first carrier gas flow rate, the second carrier gas flow rate, and the silicon source flow rate is about 2.00–2.50:0.70–0.95:1:0.15–0.25.

27. A method of manufacturing a semiconductor device as claimed in claim 26, wherein a flow rate of the second carrier gas is at least 4,000 sccm.

28. A method of manufacturing a semiconductor device as claimed in claim 27, wherein the undoped fluidal insulating layer is formed to a thickness of about 30–50 Å within five seconds.

* * * * *